US012796428B2

(12) United States Patent
Kim et al.

(10) Patent No.: US 12,796,428 B2
(45) Date of Patent: Nov. 10, 2026

(54) SEMICONDUCTOR DEVICE

(71) Applicant: SAMSUNG ELECTRONICS CO., LTD., Suwon-si (KR)

(72) Inventors: Jinkyu Kim, Suwon-si (KR); Yunsuk Nam, Suwon-si (KR); Gukhee Kim, Suwon-si (KR); Junbeom Park, Suwon-si (KR); Jaehyun Ahn, Suwon-si (KR); Darong Oh, Suwon-si (KR); Dongick Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 523 days.

(21) Appl. No.: 18/336,477

(22) Filed: Jun. 16, 2023

(65) Prior Publication Data

US 2024/0038634 A1 Feb. 1, 2024

(30) Foreign Application Priority Data

Jul. 26, 2022 (KR) ........................ 10-2022-0092309

(51) Int. Cl.
*H10W 20/20* (2026.01)
*H10B 10/00* (2023.01)
(Continued)

(52) U.S. Cl.
CPC ............ *H10W 20/20* (2026.01); *H10B 10/10* (2023.02); *H10B 10/125* (2023.02); *H10D 30/43* (2025.01);
(Continued)

(58) Field of Classification Search
CPC . H10W 20/20; H10W 20/427; H10W 20/481; H10W 20/43
See application file for complete search history.

(56) References Cited

U.S. PATENT DOCUMENTS 5,213,999 A * 5/1993 Sparks .................. H10D 1/047 438/386
11,121,086 B2 9/2021 Hiblot et al.
(Continued)

FOREIGN PATENT DOCUMENTS

KR 10-2021-0012084 A 2/2021

OTHER PUBLICATIONS

Office Action dated Apr. 15, 2026 issued in corresponding to Korean Patent Application No. 10-2022-0092309.

*Primary Examiner* — Douglas M Menz
(74) *Attorney, Agent, or Firm* — Morgan, Lewis & Bockius LLP

(57) ABSTRACT

A semiconductor device, includes: a substrate having a first region and a second region; a first device on the substrate, in the first region; a second device on the substrate, in the second region; a front side interconnection structure including a plurality of interconnection layers electrically connected to the first device and the second device, on a front side of the substrate; and a back side buried interconnection structure adjacently to a back side of the substrate opposing the front side. The back side buried interconnection structure includes a back side buried insulating layer in a trench recessed from a back side of the substrate toward the front side of the substrate, and a back side buried conductive layer in the back side buried insulating layer. The back side buried interconnection structure is located in the first region or the second region.

18 Claims, 28 Drawing Sheets

(51) Int. Cl.

| | |
|---|---|
| ***H10B 10/10*** | (2023.01) |
| ***H10D 30/43*** | (2025.01) |
| ***H10D 30/67*** | (2025.01) |
| ***H10D 62/10*** | (2025.01) |

(52) U.S. Cl.
CPC ..... *H10D 30/6735* (2025.01); *H10D 30/6757* (2025.01); *H10D 62/121* (2025.01)

(56) References Cited

U.S. PATENT DOCUMENTS

| | | | | |
|---|---|---|---|---|
| 11,239,208 | B2 | 2/2022 | Chuang et al. | |
| 2018/0145030 | A1* | 5/2018 | Beyne ................. | H10W 20/427 |
| 2018/0175034 | A1* | 6/2018 | Goktepeli ............ | H10D 84/853 |
| 2019/0164882 | A1 | 5/2019 | Chen et al. | |
| 2020/0266169 | A1 | 8/2020 | Kang et al. | |
| 2021/0358848 | A1 | 11/2021 | Wu et al. | |
| 2021/0376071 | A1 | 12/2021 | Liu et al. | |
| 2022/0059571 | A1 | 2/2022 | Baek et al. | |

* cited by examiner

SEMICONDUCTOR DEVICE

CROSS-REFERENCE TO RELATED APPLICATION

This U.S. non-provisional patent application claims priority under 35 USC 119(a) to Korean Patent Application No. 10-2022-0092309, filed on Jul. 26, 2022, with the Korean Intellectual Property Office, the disclosure of which is incorporated by reference in its entirety herein.

1. TECHNICAL FIELD

The present inventive concept relates to a semiconductor device.

2. DISCUSSION OF RELATED ART

A semiconductor device is an electronic component that relies on electronic properties of a semiconductor material for its function. Semiconductor devices are manufactured both as single discrete devices and as an integrated circuit (IC). An example of the semiconductor device includes a transistor such as metal-oxide-semiconductor field-effect-transistor (MOSFET), which may be present in a logic circuit or a memory device. The transistor includes a source region and a drain region.

A back end of line (BEOL) is a part of an IC fabrication process where the transistor becomes interconnected with wiring on a substrate. For example, the source region and the drain region may be connected to interconnections of a back end of line (BEOL) through a contact plug. Meanwhile, as semiconductor devices are highly integrated, a Back Side Power Distribution Network (BSPDN) in which interconnections are disposed on a back side of the substrate that opposes, the front side of the substrate may be disposed.

SUMMARY

An aspect of the present inventive concept is to provide a semiconductor device having increased integration and capable of being manufactured more efficiently.

According to an aspect of the present inventive concept, a semiconductor device, includes: a substrate having a first region, a second region, and a third region; a first device disposed on a front side of the substrate, in the first region, wherein the first device includes a first active region, a first gate crossing the first active region, and first source/drain regions disposed on the first active region on both sides of the first gate; a second device disposed on the front side of the substrate, in the second region; a through-electrode penetrating through the substrate, in the third region; a contact plug electrically connected to the first source/drain regions; a buried conductive layer connected to the contact plug, and penetrating through a first device isolation layer defining the first active region in the substrate and extending deeper into the substrate than the first device isolation layer; and a back side buried interconnection structure disposed adjacent to a back side of the substrate opposing the front side of the substrate. The back side buried interconnection structure includes a back side buried conductive layer disposed on the buried conductive layer in the first region and connected to the buried conductive layer. The back side buried interconnection structure is not disposed on the back side of the substrate in the second region.

According to an aspect of the present inventive concept, a semiconductor device, may include: a substrate having a first region and a second region; a first device disposed on the substrate in the first region; a second device disposed on the substrate in the second region; a frontside interconnection structure including a plurality of interconnection layers electrically connected to the first device and the second device on a front side of the substrate; and a back side buried interconnection structure disposed adjacent to a back side of the substrate that opposes the front side of the substrate. The back side buried interconnection structure includes a back side buried insulating layer disposed in a trench recessed from the back side of the substrate toward the front side of the substrate, and a back side buried conductive layer disposed in the back side buried insulating layer. The back side buried interconnection structure is disposed in the first region or the second region.

According to an aspect of the present inventive concept, a semiconductor device, may include: a substrate having a first region and a second region; a first device disposed on a front side of the substrate, in the first region, wherein the first device includes an active region, a gate crossing the active region, and source/drain regions disposed on the active region on both sides of the gate; a back side insulating structure disposed on a back side of the substrate opposing the front side of the substrate, in the second region; a second device disposed on the back side of the substrate, in the second region, a buried conductive layer, and a back side buried conductive layer. The second device includes an epitaxial layer penetrating through the back side insulating structure in the second region and in a back side trench recessing the back side of the substrate. The epitaxial layer includes a first impurity region of a first conductivity-type, a second impurity region of a second conductivity-type, different from the first conductivity-type, and a third impurity region of the first conductivity-type. The buried conductive layer is electrically connected to the source/drain regions, and penetrates through a device isolation layer defining the active region in the substrate and extends deeper into the substrate than the device isolation layer. The back side buried conductive layer penetrates through the insulating structure and is connected to the buried conductive layer, in the first region.

BRIEF DESCRIPTION OF DRAWINGS

The above and other aspects and features of the present inventive concept will be more clearly understood from the following detailed description taken in conjunction with the accompanying drawings, in which.

DETAILED DESCRIPTION

Figure 1A:
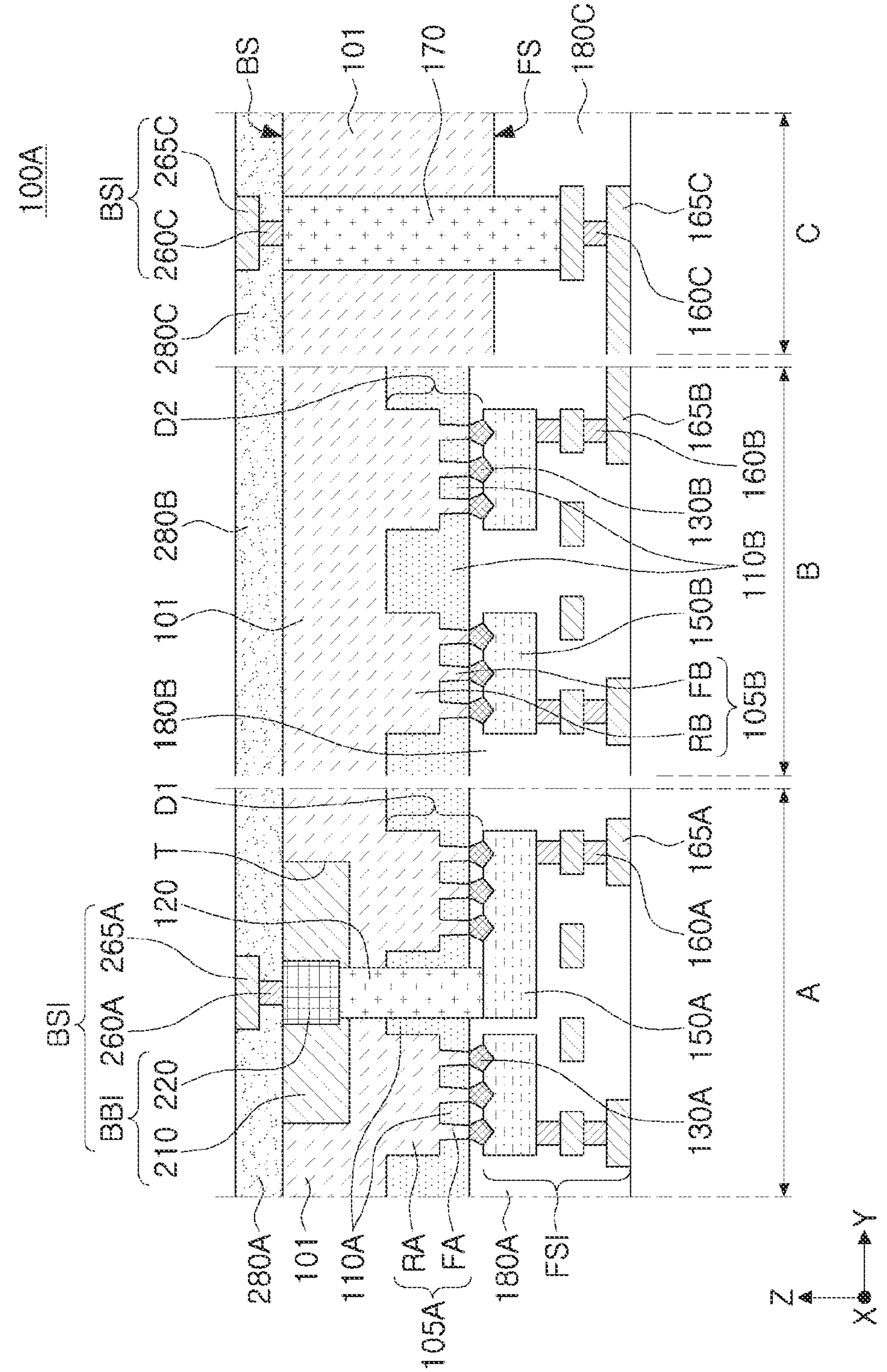
FIGS. 1A and 1B are cross-sectional views illustrating a semiconductor device according to an example embodiment.

Hereinafter, example embodiments of the present inventive concept will be described with reference to the accompanying drawings. Hereinafter, terms such as 'an upper side', 'an upper portion', 'an upper surface', a lower side, a lower portion, a lower surface, and the like, may be understood as referring to the drawings, except where otherwise indicated by reference numerals.

Figure 1B:
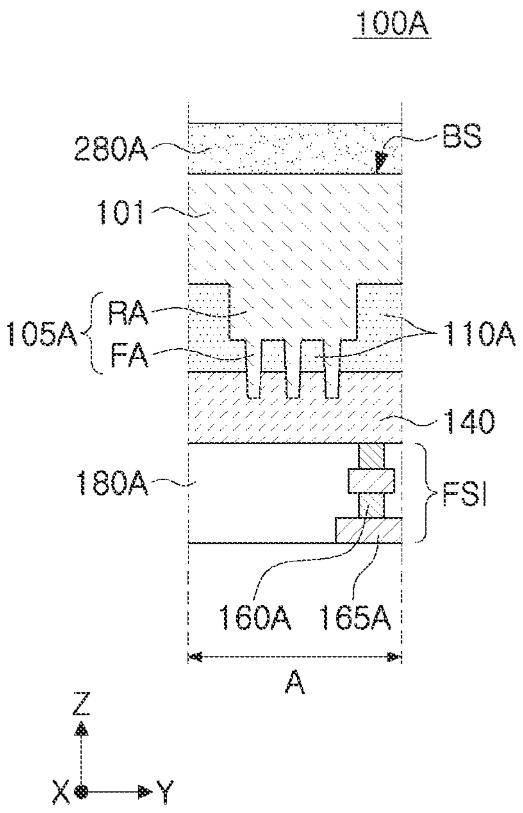

FIGS. 1A and 1B are cross-sectional views illustrating a semiconductor device according to an example embodiment.

Referring to FIGS. 1A and 1B, a semiconductor device 100A according to an example embodiment includes a substrate 101 having a first region A, a second region B, and a third region C, first devices D1 disposed on a front side FS of the substrate 101 in the first region A, a buried conductive layer 120 buried in the substrate 101 in the first region A, second devices D2 disposed on a front side FS of the substrate 101 in the second region B, a through-electrode 170 penetrating through the substrate 101 in the third region C, a front side interconnection structure FSI disposed on a front side FS of the substrate 101, and a back side interconnection structure BSI disposed adjacent to a back side BS of the substrate 101. The semiconductor device 100A may further include device isolation layers 110A and 110B, front side interlayer insulating layers 180A, 180B, and 180C, and back side interlayer insulating layers 280A, 280B, and 280C. FIG. 1B shows a cross section of a portion of a first region A in a region spaced apart from a region of the first region A shown in FIG. 1A along the X direction.

The substrate 101 may include a semiconductor material, for example, a group IV semiconductor, a group III-V compound semiconductor, or a group II-VI compound semiconductor. For example, the group IV semiconductor may include silicon (Si), germanium (Ge), or silicon germanium (SiGe). The substrate 101 may be provided as a bulk wafer, an epitaxial layer, a silicon on insulator (SOI) layer, a semiconductor on insulator (SeOI) layer, or the like.

Devices having various functions may be disposed on the substrate 101. For example, the second region B of the substrate 1001 may be a cell region in which memory cells of a static random access memory (SRAM) device or a dynamic random access memory (DRAM) device are disposed, and the first region A of the substrate 101 may be a peripheral circuit region in which peripheral circuits for driving the memory cells are disposed or a region in which a logic device is disposed. The third region C of the substrate 101 may be a region in which the through-electrode 170 electrically connected to an input/output (I/O) transistor is disposed.

The first device D1 may include a first active region 105A extending in an X-direction, a first gate 140 crossing the first active region 105A and extending in a Y-direction, and first source/drain regions 130A disposed on the first active region 105A on both sides of the first gate 140. For example, the source region could be disposed on a first side of the first gate 140 and the drain region could be disposed on a second side of the first gate 140 that opposes the first side. For example, the source region could be disposed to the left of the first gate 140 and the drain region could be disposed to the right of the first gate 140, or vice versa.

The first active region 105A may include a first base active region RA and a first active fin FA. The first active fin FA may be defined or limited by the first device isolation layer 110A in the substrate 101, and may extend in a X-direction. The first active fin FA may protrude from the first base active region RA, and may have a fin structure. The first active fin FA may include impurities. The first active fin FA may be disposed in plural and spaced apart from each other in a Y-direction.

The first device isolation layer 110A may define a first active region 105A in the substrate 101. The first device isolation layer 110A may include, for example, a first portion formed by a shallow trench isolation (STI) process defining the first active fin FA, and a second portion formed by a deep trench isolation (DTI) process defining the first base active region RA. The second portion may extend deeper into the substrate 101 than the first portion. The first device isolation layer 110A may include, for example, a silicon oxide or a silicon nitride-based insulating material such as Tetra Ethyl Ortho Silicate (TEOS), Undoped Silicate Glass (USG), PhosphoSilicate Glass (PSG), Borosilicate Glass (BSG), BoroPhosphoSilicate Glass (BPSG), Fluoride Silicate Glass (FSG), Spin On Glass (SOG), Tonen SilaZene (TOSZ), or a combination thereof.

The first gate 140 may cover the first active fin FA of the first active region 105A. For example, the first gate 140 may cover upper surfaces of fins of the first active fin FA and part of side surfaces of the fins. A channel region of a transistor may be formed in the first active fin FA crossing the first gate 140. The first gate 140 may include a gate dielectric layer and a gate electrode. The first gate 140 may be electrically connected to first interconnection layers 165A.

The gate dielectric layer may be disposed between the first active fin FA and the gate electrode. The gate dielectric layer may include an oxide, nitride, or high-k material. The high-k material may refer to a dielectric material having a higher dielectric constant than that of a silicon oxide film ($SiO_2$). The high dielectric constant material may be, for example, at least one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

The gate electrode may be spaced apart from the first active fin FA by the gate dielectric layer. The gate electrode may include a conductive material, for example, a metal nitride such as titanium nitride (TiN), tantalum nitride (TaN), or tungsten nitride (WN), and/or a metal material such as aluminum (Al), tungsten (W), or molybdenum (Mo), or a semiconductor material such as doped polysilicon. The gate electrode may be composed of two or more multi-layers. The gate electrode may be electrically insulated from source/drain regions 130A through space layers.

The first source/drain regions 130A may be provided as a source region or a drain region of the transistor. For example, one of the first source/drain regions 130A could be the source region and another one of the first source/drain regions 130A could be the drain region. The first source/drain regions 130A may be respectively connected to the first active fins FA. The first source/drain regions 130A may be a semiconductor layer including silicon (Si), and may be formed of an epitaxial layer. The first source/drain regions 130A may include impurities. For example, the first source/drain regions 130A may include N-type doped silicon (Si) or P-type doped silicon germanium (SiGe). The first source/drain regions 130A may include a plurality of regions including an element and/or a doping element having different concentrations. In another example, the first source/drain regions 130A may be merged with each other in the Y-direction.

The buried conductive layer 120 may be disposed adjacent to the first active region 105A. The buried conductive layer 120 may penetrate through the first device isolation layer 110A, and extend deeper into the substrate 101 than the first device isolation layer 110A. For example, the buried conductive layer 120 may be disposed between a first pattern and a second pattern of the first active regions 105A adjacent to each other. The buried conductive layer 120 may extend from the front side FS of the substrate 101 toward the back side BS of the substrate 101 in the first region A. In an embodiment, an upper portion of the buried conductive layer 120 protrudes onto a lower surface of the back side buried insulating layer 210.

The buried conductive layer 120 may be connected to a portion of first contact plugs 150A of the front side interconnection structure FSI. The buried conductive layer 120 may receive a power supply voltage from the back side interconnection structure BSI on the back side BS of the substrate 101, and may serve as an electrical path supplying a power supply voltage to the first devices D1 through the first contact plugs 150A. The buried conductive layer 120 may be connected to a back side buried conductive layer 220 extending from the back side BS of the substrate 101. For example, a voltage generator may be present that provides the power supply voltage.

In an embodiment, the buried conductive layer 120 include a conductive layer and a barrier film surrounding the conductive layer. The barrier film may include a metal compound such as titanium nitride (TiN), tantalum nitride (TaN), or tungsten nitride (WN), and the conductive layer may include, for example, a metal material such as tungsten (W), titanium (Ti), aluminum (Al), or copper (Cu). In an example embodiment, insulating spacer layers, electrically separated from the substrate 101 are disposed on a side surface of the buried conductive layer 120.

The second device D2 may include a second active region 105B, a second gate, and second source/drain region 130B disposed on the second active region 105B on both sides of the second gate. The second active region 105B may include a second base active region RB and a second active fin FB. Components constituting the second device D2 are similar to components constituting the first device D1, and thus, descriptions thereof will be cited.

In an embodiment, in the second region B, a back side buried interconnection structure BBI is not disposed on the back side BS of the substrate 101. For example, a configuration such as the buried conductive layer 120 of the first region A may not be formed around the second active region 105B. In an embodiment, a back side buried interconnection structure BBI is not disposed in any part of the second region B. In the second region B, the back side BS of the substrate 101 may be flat or substantially flat. The second devices D2 may receive a power supply voltage through second contact plugs 150B, a portion of the second interconnection layers 165B, a portion of the third interconnection layers 165C, and a through-electrode 170.

The through-electrode 170 may be a through silicon via (TSV) penetrating through the substrate 101 in the third region C. The through-electrode 170 may penetrate through the front side FS of the substrate 101, to be connected to at least one of the third interconnection layers 165C of the front side interconnection structure FSI. In an embodiment, the through-electrode 170 includes a conductive plug and a barrier film surrounding the same. The barrier film may include a metal compound such as titanium nitride (TiN), tantalum nitride (TaN), or tungsten nitride (WN), and the conductive plug may include, for example, a metal material such as tungsten (W), titanium (Ti), aluminum (Al), or copper (Cu). In an example embodiment, insulating spacer layers for electrical separation from the substrate 101 may be disposed on a side surface of the through-electrode 170.

The through-electrode 170 may be formed in, for example, a via-first structure, a via-middle structure, or a via-last structure. The via-first may refer to a structure in which the through-electrode 170 is first formed before individual elements on the front side FS of the substrate 101 are formed. The via-middle may refer to a structure in which the through-electrode 170 is formed before a front side interconnection structure FSI, a back end of line (BEOL), after the individual elements are formed. The via-last may refer to a structure in which the through-electrode 170 is formed after all the front side interconnection structures BSI are formed.

The front side interconnection structure FSI may be disposed on the front side FS of the substrate 101, to constitute the BEOL. In the first region A, the front side interconnection structure FSI may include first contact plugs 150A disposed on the front side FS of the substrate 101, first vias 160A electrically connected to the first contact plugs 150A, and first interconnection layers 165A electrically connected to the first vias 160A.

In the second region B, the front side interconnection structure FSI may include second contact plugs 150B disposed on the front side FS of the substrate 101, second vias 160B electrically connected to the second contact plugs 150B, and second interconnection layers 165B electrically connected to the second vias 160B.

In the third region C, the front side interconnection structure FSI may be disposed in the front side FS of the substrate 101, and may include third interconnection layers 165C electrically connected to the through-electrode 170 and third vias 160C electrically connecting the third interconnection layers 165C to each other.

The first contact plugs 150A may be connected to the first source/drain regions 150A, and the second contact plugs 150B may be connected to the second source/drain regions 150B. The front side interconnection structure FSI may be disposed within the front interlayer insulating layers 180A, 180B, and 180C, wherein the front side interlayer insulating layers 180A, 180B, and 180C may include at least one of, for example, of silicon oxide, silicon nitride, and silicon oxynitride.

The back side interconnection structure BSI may be disposed adjacent to the back side BS of the substrate 101. The back side interconnect structure BSI may include a back side buried interconnection structure BBI, a first back side via 260A, a first back side interconnection layer 265A, a second back side via 260C, and a second back side interconnection layer 265C.

In the first region A, the back side buried interconnection structure BBI may include a back side buried insulating layer 210 disposed in a trench T recessed from the back side BS of the substrate 101 toward the front side FS of the substrate 101 and a back side buried conductive layer 220 in the back side buried insulating layer 210. The back side buried insulating layer 210 may surround side surfaces of the back side buried conductive layer 220. In an embodiment, an upper surface of the back side buried insulating layer 210 and an upper surface of the back side buried conductive layer 220 are coplanar or substantially coplanar.

In an embodiment, a lower surface of the back side buried insulating layer 210 is positioned on a lower level than a lower surface of the back side buried conductive layer 220. The first back side interconnection layer 265A may be electrically connected to the back side buried conductive layer 220, and the second back side interconnection layer 265C may be electrically connected to the through-electrode 170. A step may be provided by the trench T on the back side BS of the substrate 101 in the first region A. For example, a portion of the substrate 101 in the first region A may have a step shape due to the trench T.

The back side interconnection structure BSI may be disposed in any one selected from a first region A and a second region B. For example, the back side interconnection structure BSI may be located on the back side BS of the substrate 101 in the first region A, but is not located on the back side BS of the substrate 101 in the second region B. Second back side interconnection layers 265C of the back side interconnection structure BSI may be provided on the back side BS of the substrate 101 in the third region C. The back side interconnection layers 265A and 265C and the back side vias 260A and 260C of the back side interconnect structure BSI may be disposed in the back side interlayer insulating layers 280A, 280B, and 280C.

Figure 2:
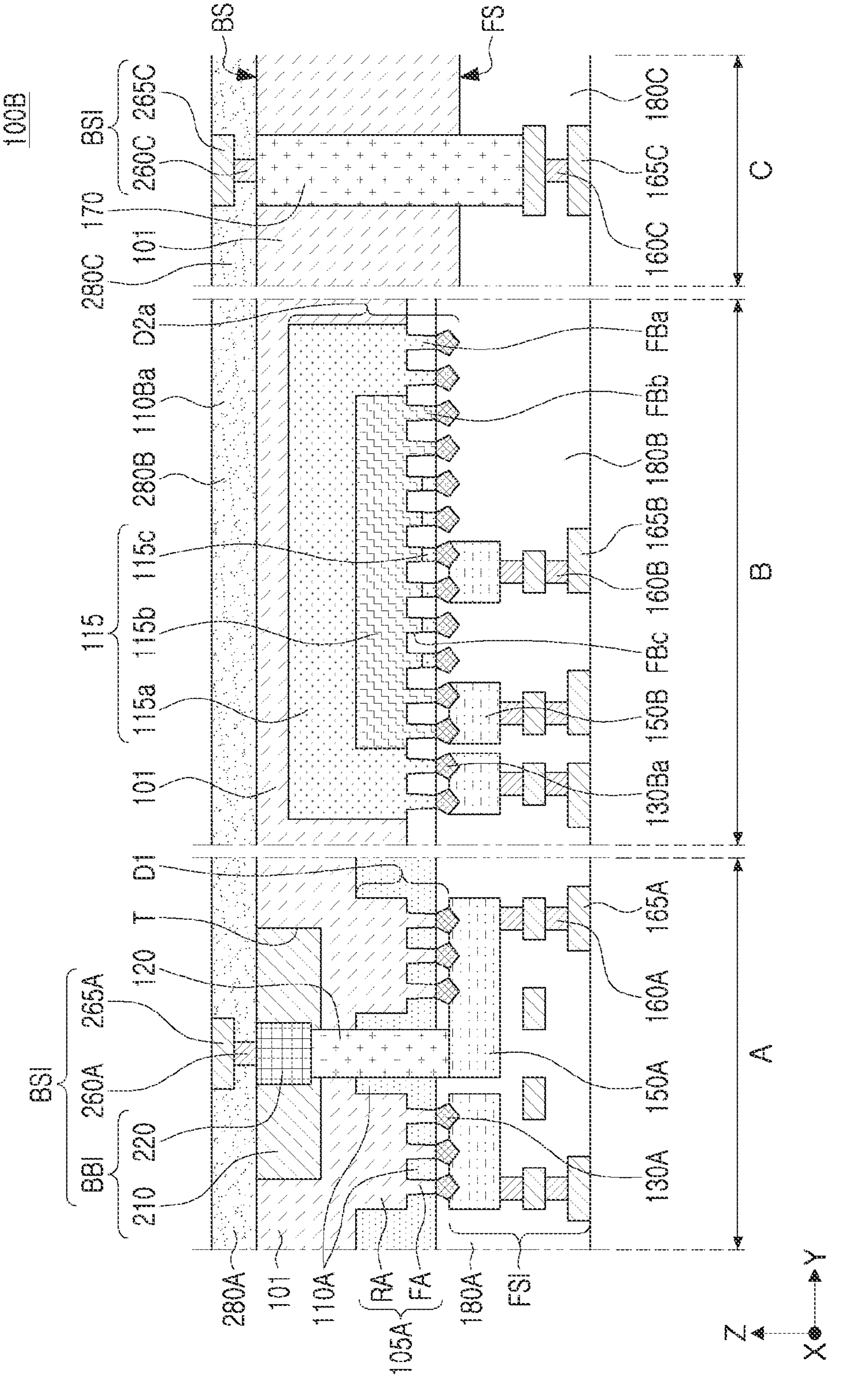
FIG. 2 is a cross-sectional view illustrating a semiconductor device according to an example embodiment.

FIG. 2 is a cross-sectional view illustrating a semiconductor device according to an example embodiment.

Referring to FIG. 2, compared to the semiconductor device 100A of FIGS. 1A and 1B, in a semiconductor device 100B according to an example embodiment, a second region B may be a region in which a bipolar junction transistor device is disposed therein. For example, in the second region B, a second device D2*a* disposed in the substrate 101 may include impurity regions 115 providing a bipolar junction transistor including a baser, an emitter, and a collector.

The impurity regions 115 may include a first impurity region 115*a*, a second impurity region 115*b*, and a third impurity region 115*c*. The first impurity region 115*a* and the third impurity region 115*c* may include impurities of a first conductivity-type (N-type or P-type), and the second impurity region 115*b* may include impurities of a second conductivity-type (P-type or N-type), different from the first conductivity-type. The first impurity region 115*a* may be disposed to surround at least a portion of the second impurity region 115*b*.

The second device D2*a* may further include active fins FBa, FBb, and FBc. The active fins FBa, FBb, and FBc may include a first fin pattern FBa including a first impurity region 115*a*, a second fin pattern FBb including a second impurity region 115*b*, and a third fin pattern FBc including a third impurity region 115*c*. The active fins FBa, FBb, and FBc may be connected to epitaxial layers 130Ba.

The back side buried interconnection structure BBI may be disposed on the back side BS of the substrate 101 in the first region A, but the second device D2*a* including a vertical bipolar junction transistor may be disposed in the second region B, so that the back side buried interconnection structure BBI need not be provided on the back side BS of the substrate 101 in the second region B. A predetermined thickness may be required to form the bipolar junction transistor in the substrate 101, and when a wafer is back-grinded, it may be difficult to implement the device. According to an example embodiment of the present inventive concept, before a Front End of Line (FEOL) process, the front side FS of the substrate 101 may be etched in the second region B, and then impurity regions 115 may be formed by an epitaxial growth process. Since the impurity regions 115 having an increased doping concentration are provided by the epitaxial growth process, depth or thickness of the region in which the second device D2*a* including the vertical bipolar junction transistor is disposed may be reduced. In addition, the epitaxial growth process may require a high temperature, and since the impurity regions 115 are formed in the second region B before the FEOL process, a risk of damage to other devices due to the high temperature can be reduced.

Figure 3:
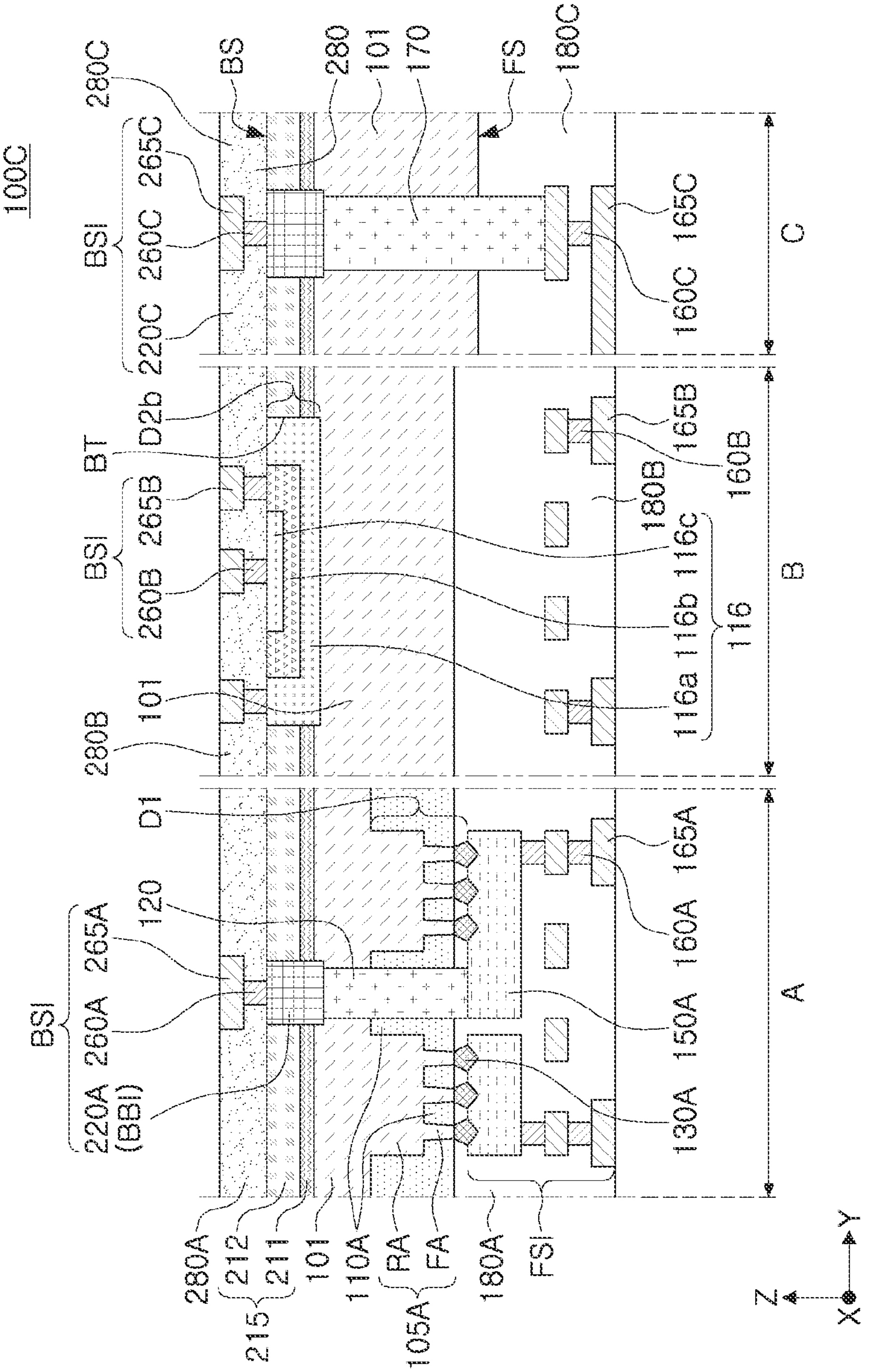
FIG. 3 is a cross-sectional view illustrating a semiconductor device according to an example embodiment.

FIG. 3 is a cross-sectional view illustrating a semiconductor device according to an example embodiment.

Referring to FIG. 3, a semiconductor device 100C according to an example embodiment may further include a back side insulating structure 215 on a back side BS of the substrate 101, and may include a second device D2*b* located a predetermined depth from the back side BS of the substrate 101 in the second region B. The second device D2*b* may include an epitaxial layer 116 disposed in a back side trench BT penetrating through a back side insulating structure 215 and recessing the back side BS of the substrate 101. The semiconductor device 100C may further include a third back side via 260B and a third back side interconnection layer 265B electrically connected to the epitaxial layer 116.

The epitaxial layer 116 may provide a bipolar junction transistor including a base, an emitter, and a collector, and include a first impurity region 116*a*, a second impurity region 116*b*, and a third impurity region 116*c*. The impurity regions 116*a*, 116*b*, and 116*c* may be formed by ion implantation into the epitaxial layer 116. The first impurity region 116*a* and the third impurity region 116*c* may include impurities of a first conductivity-type (N-type or P-type), and the second impurity region 116*b* may include impurities of a second conductivity-type (P-type or N-type), different from the first conductivity-type.

In the first region A, the first back side buried conductive layer 220A, a back side buried interconnection structure BBI, may penetrate through a back side insulating structure 215 and be connected to the buried conductive layer 120, and may be connected to the buried conductive layer 120. In the third region C, the second back side buried conductive layer 220C may penetrate through the back side insulating structure 215 and may be connected to the through-electrode 170. The back side insulating structure 215 may include an etch stop layer 211 and an insulating layer 212 disposed on the etch stop layer 211. In an embodiment, an upper surface of the first back side buried conductive layer 220A and an upper surface of the second back side buried conductive layer 220C are coplanar or substantially coplanar with an upper surface of the insulating layer 212.

On one wafer including the substrate 101 without changing a structure of the second device D2*b*, depending on characteristics of the devices, it may be determined whether or not to dispose back side buried interconnection structures 220A and 220C on the back side BS of the substrate 101 for each region in which respective devices are disposed. In particular, even if a thickness of the substrate for forming a general bipolar junction transistor is not provided by back grinding a wafer, the back side BS of the substrate 101 may be partially exposed to form an epitaxial layer 116, so that a bipolar junction transistor may be implemented even on a wafer to which the back side buried interconnection structures 220A and 220C is applied.

Figure 4:
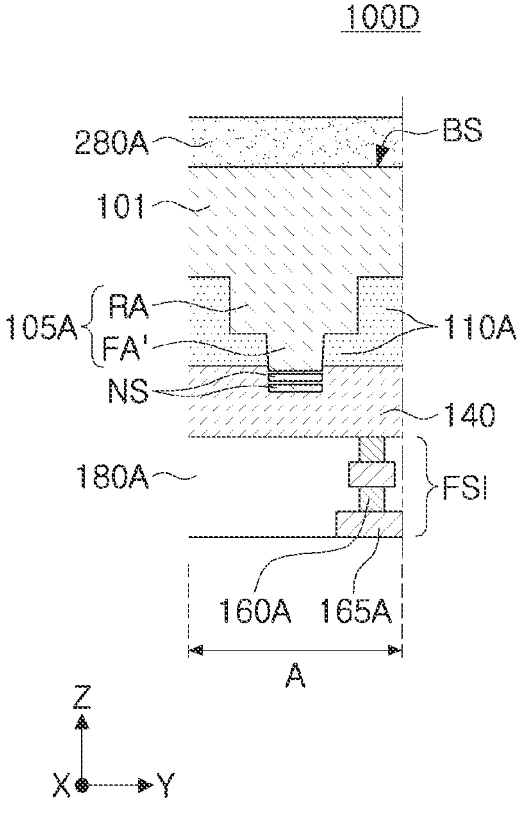
FIG. 4 is a cross-sectional view illustrating a semiconductor device according to an example embodiment.

FIG. 4 is a cross-sectional view illustrating a semiconductor device according to an example embodiment.

Referring to FIG. 4, a semiconductor device 100D according to an example embodiment may further include a plurality of channel layers NS disposed to be vertically spaced apart from each other on a first active fin FA' in a first region A. The semiconductor device 100D may include gate-all-around-type transistors between the first active fin FA' and the channel layers NS and between the channel layers NS. For example, the semiconductor device 100D may include transistors of a Multi Bridge Channel FET (MBCFET™) structure formed by the channel layers NS, first source/drain regions 150A, and a first gate 140.

The channel layers NS may include two or more layers disposed to be spaced apart from each other in a direction (Z-direction) perpendicular to an upper surface of the first active fin FA' on the first active fin FA. The channel layers NS may be connected to the first source/drain regions 150A. The channel layers NS may be formed of a semiconductor material, and may include, for example, at least one of silicon (Si), silicon germanium (SiGe), and germanium (Ge). The channel layers NS may be formed of, for example, the same material as the substrate 101. The number and shape of the channel layers NS constituting one channel structure may be variously changed in example embodiments.

Figure 5A:
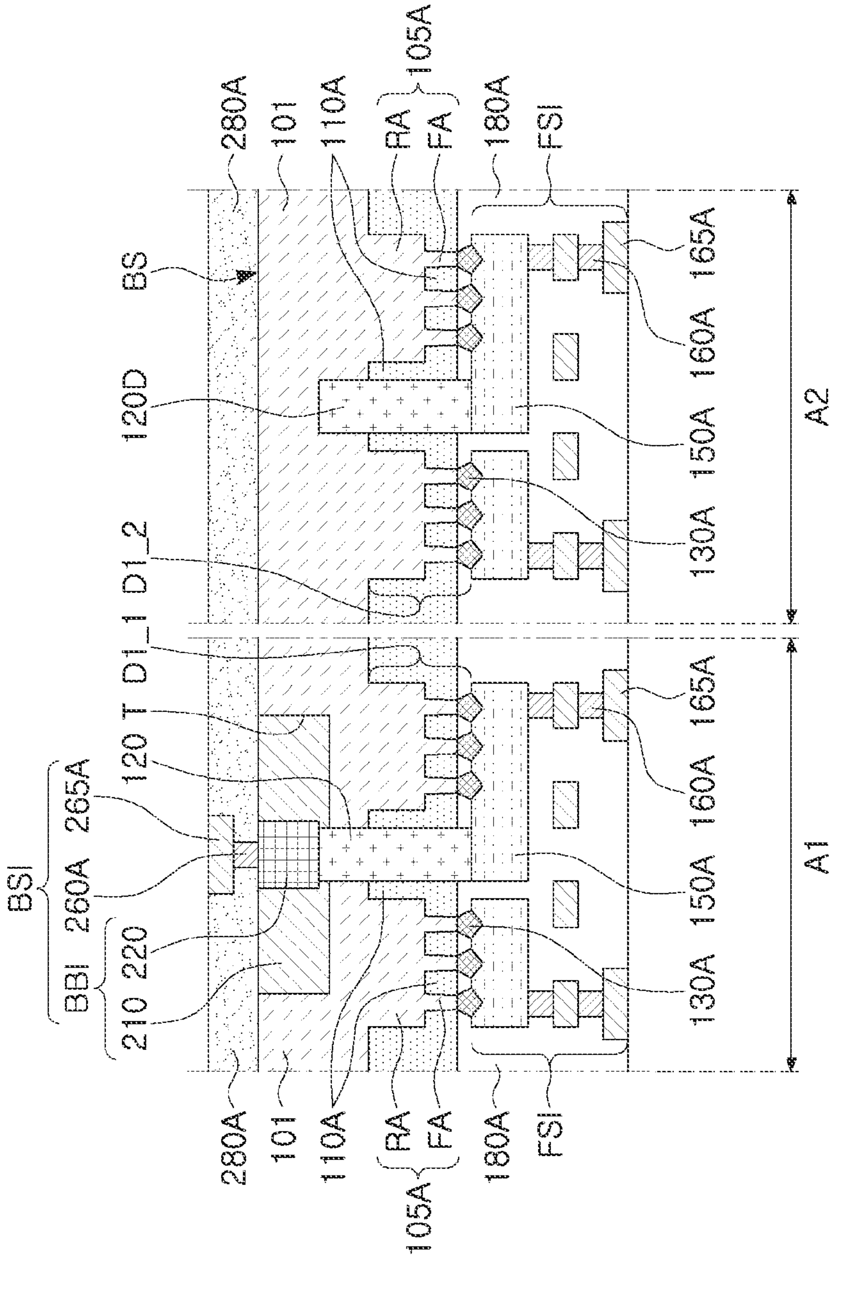
FIGS. 5A to 5C are cross-sectional views illustrating a semiconductor device according to example embodiments.
Figure 5B:
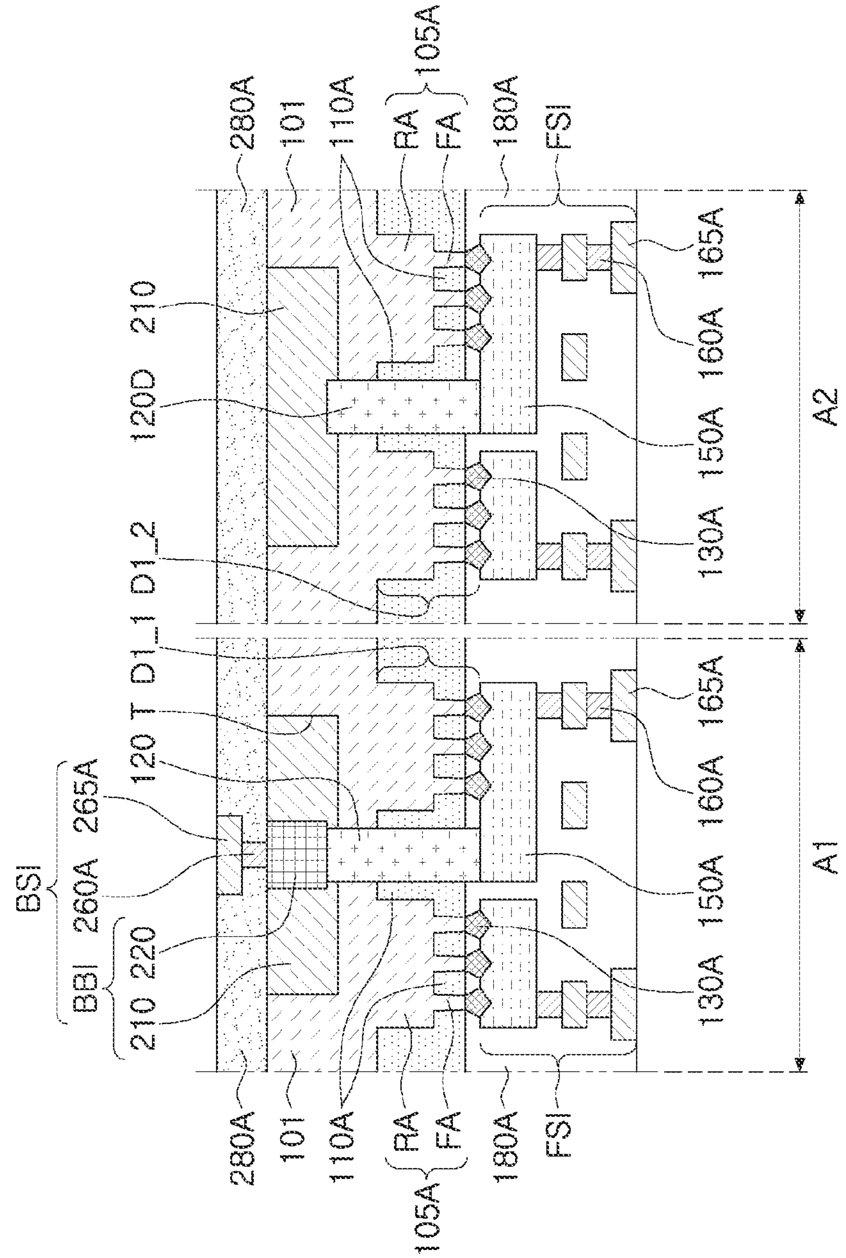
Figure 5C:
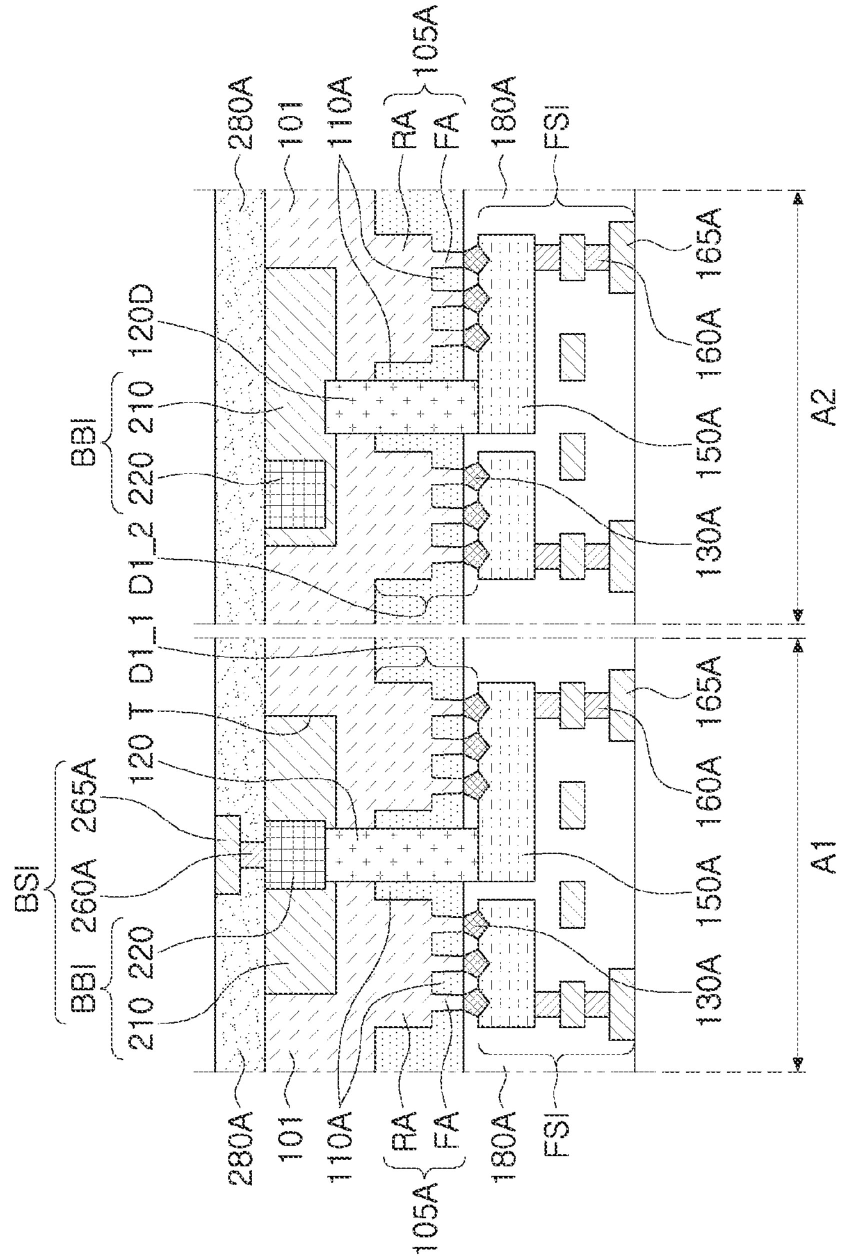

FIGS. 5A to 5C are cross-sectional views illustrating a semiconductor device according to example embodiments.

Referring to FIGS. 5A to 5C, the substrate 101 may have a first logic region A1 and a second logic region A2. In the first logic region A1, first logic devices D1_1 may be disposed on a front side FS of the substrate 101, and in the second logic region A2, second logic devices D1_2 may be disposed on a front side FS of the substrate 101. In this case, the buried conductive layer 120D disposed in the second logic region A2 may be a dummy interconnection that is not electrically connected to the back side interconnection structure BSI.

Referring to FIG. 5A, a back side interconnection structure BSI including a back side buried interconnection structure BBI may be disposed on a back side BS of the substrate 101 in the first logic region A1, but in the second logic region A2, a back side buried interconnection structure BBI is not disposed on the back side BS of the substrate 101.

Referring to FIG. 5B, in the second logic region A2, a back side buried conductive layer 220 is not disposed on a back side BS of the substrate 101, but only a back side buried insulating layer 210 is disposed.

Referring to FIG. 5C, a back side buried structure BBI is disposed on a back side BS of the substrate 101 in the second logic region A2, but the back side buried conductive layer 220 need not be aligned with a buried conductive layer 120D disposed in the second logic region A2, and need not be connected to the buried conductive layer 120D.

FIGS. 6A to 6F are diagrams illustrating a process sequence to illustrate a method of manufacturing a semiconductor device according to an example embodiment.

Figure 6A:
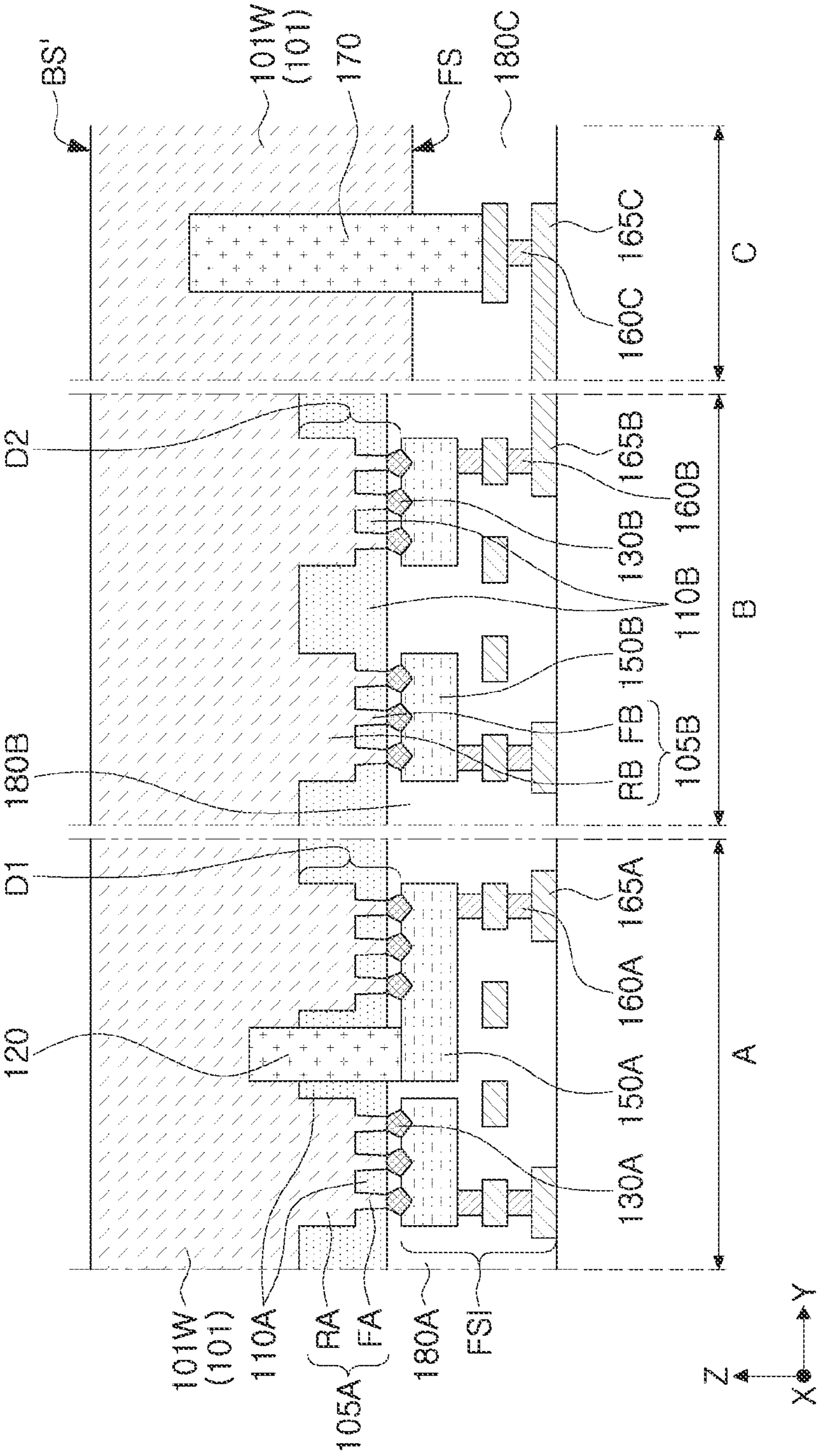
FIGS. 6A to 6F are diagrams illustrating a process sequence to illustrate a method of manufacturing a semiconductor device according to an example embodiment.

Referring to FIG. 6A, first devices D1 and second devices D2 are formed on a front side FS of the semiconductor wafer 101W including the substrate 101 by a FEOL process, and a buried conductive layer 120, a through-electrode 170, and a front side interconnection structure FSI are formed. The front side interconnection structure FSI may be formed by a BEOL process. The semiconductor wafer 101W is a semiconductor wafer in a state before a back side BS' is back-grinded, and may have a relatively thick thickness.

Figure 6B:
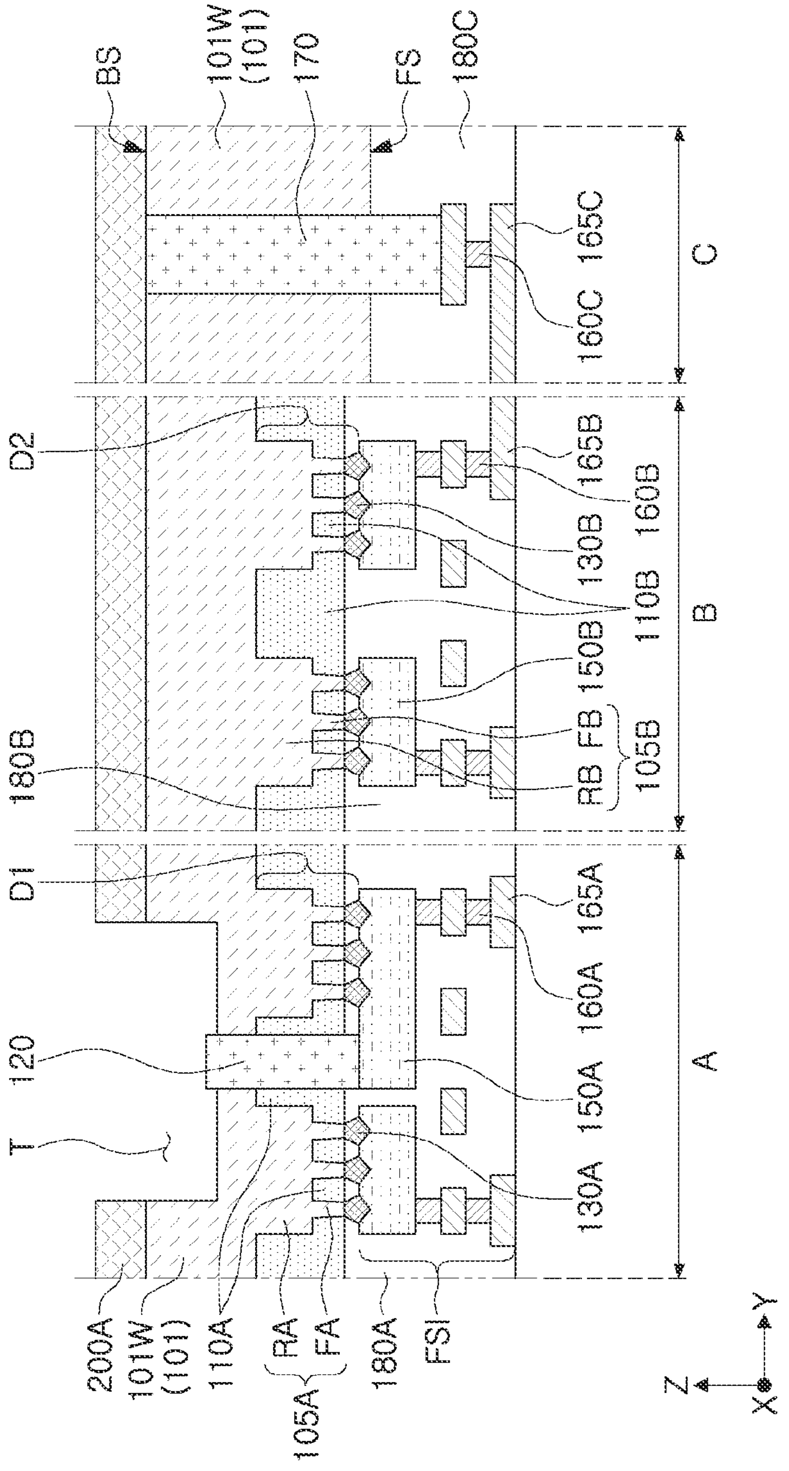

Referring to FIG. 6B, a back side grinding process may be performed on the back side BS' of the semiconductor wafer 101W to reduce a thickness of the semiconductor wafer 101W to form a back side BS, and a first mask layer 200A may be formed on the back side BS of the semiconductor wafer 101W. A trench T, recessed in a direction from the back side BS of the substrate 101 toward the front side FS of the substrate 101 in the first region A may be formed. By the back side grinding process, the back side BS of the semiconductor wafer 101W may be lowered until an upper surface of the through-electrode 170 is exposed. A first mask layer 200A may be formed on the back side BS of the semiconductor wafer 101W, and a photo process and an etching process may be performed to partially open the first mask layer 200A. A trench T may be formed by etching the back side BS of the substrate 101 under the partially open region of the first mask layer 200A. An upper portion of the buried conductive layer 120 may be exposed through the trench T.

Figure 6C:
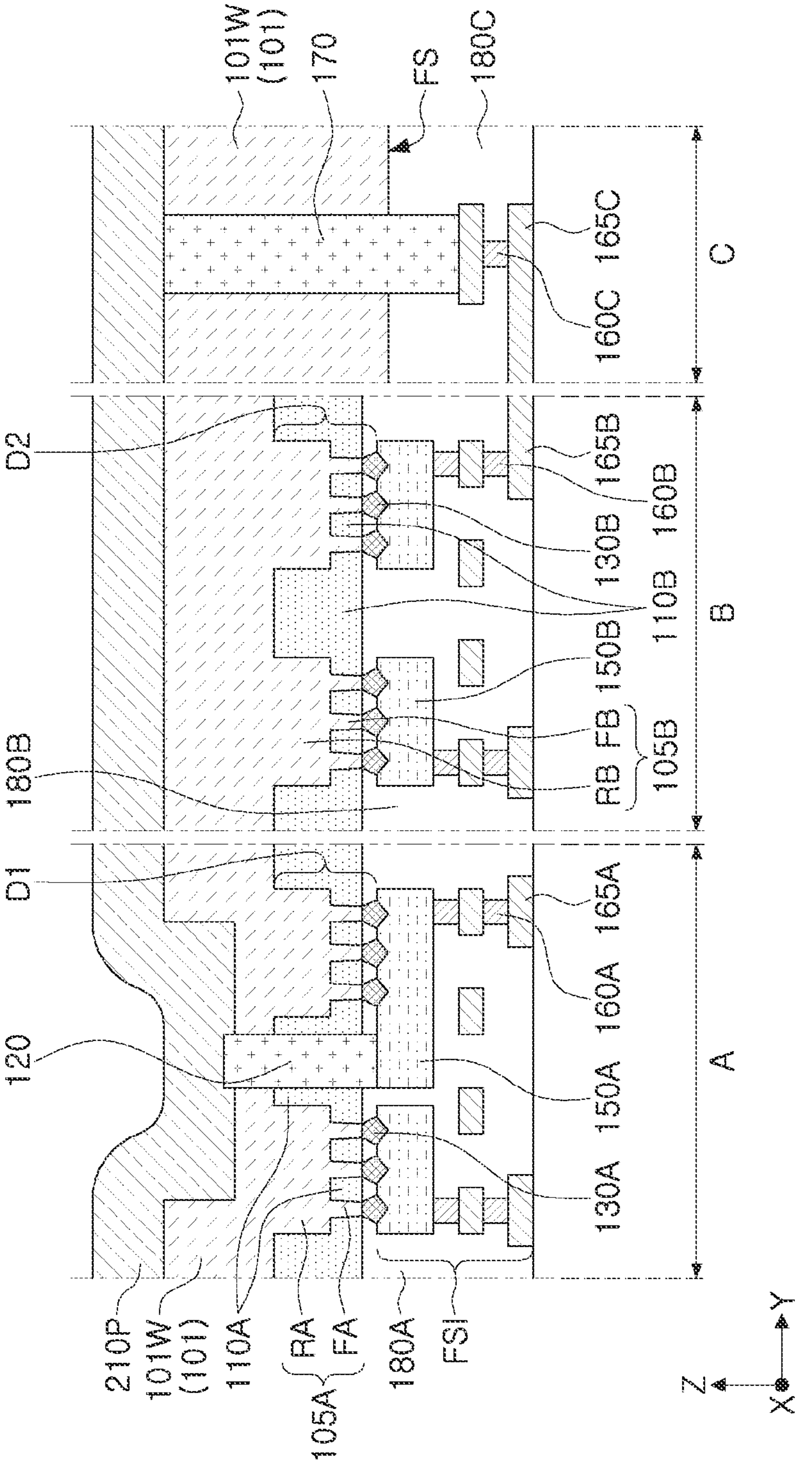

Referring to FIG. 6C, an insulating material layer 210P filling the trench T may be formed. Before forming the insulating material layer 210P, a first mask layer 200A may be removed. The insulating material layer 210P may cover the back side BS of the semiconductor wafer 101W.

Figure 6D:
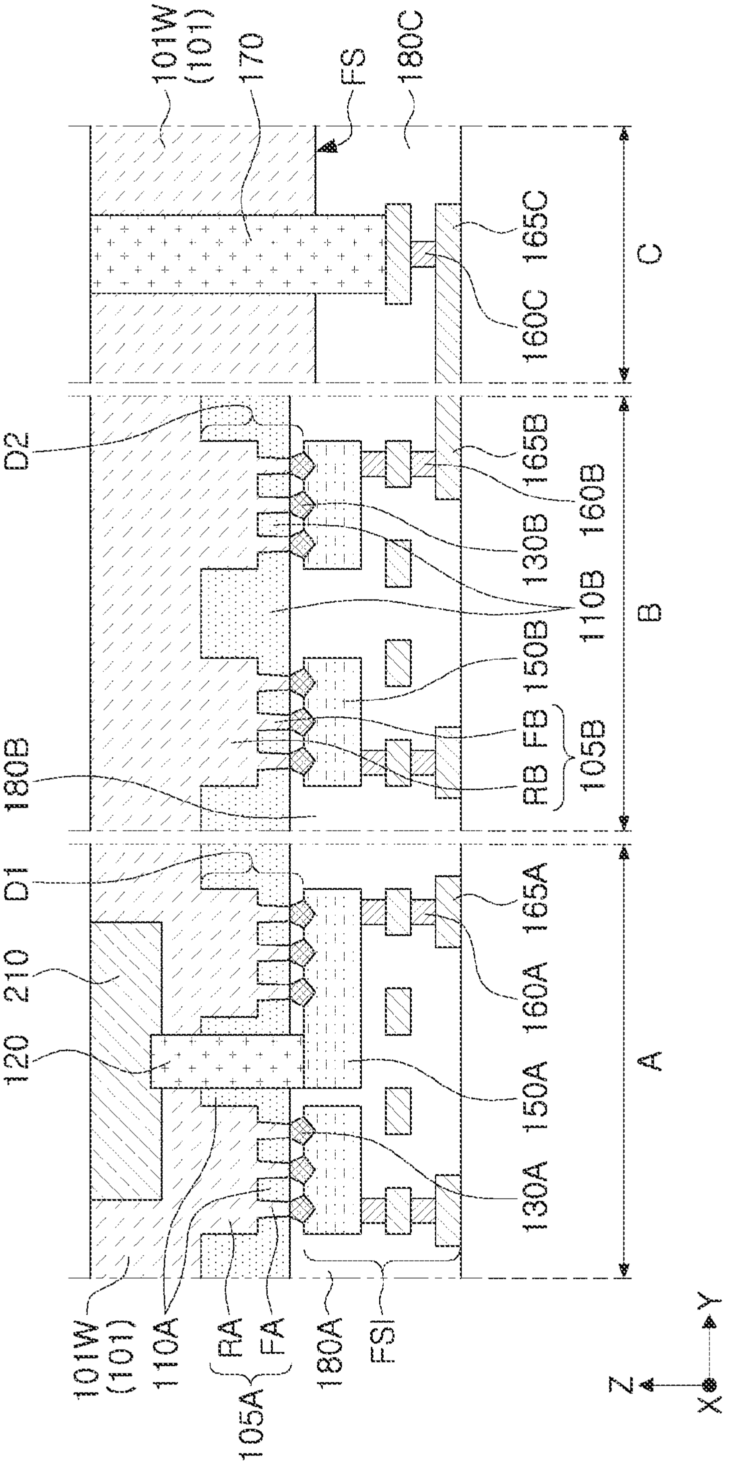

Referring to FIG. 6D, a planarization process for the insulating material layer 210P may be performed until the back side BS of the semiconductor wafer 101W is exposed, to form a back side buried insulating layer 210.

Figure 6E:
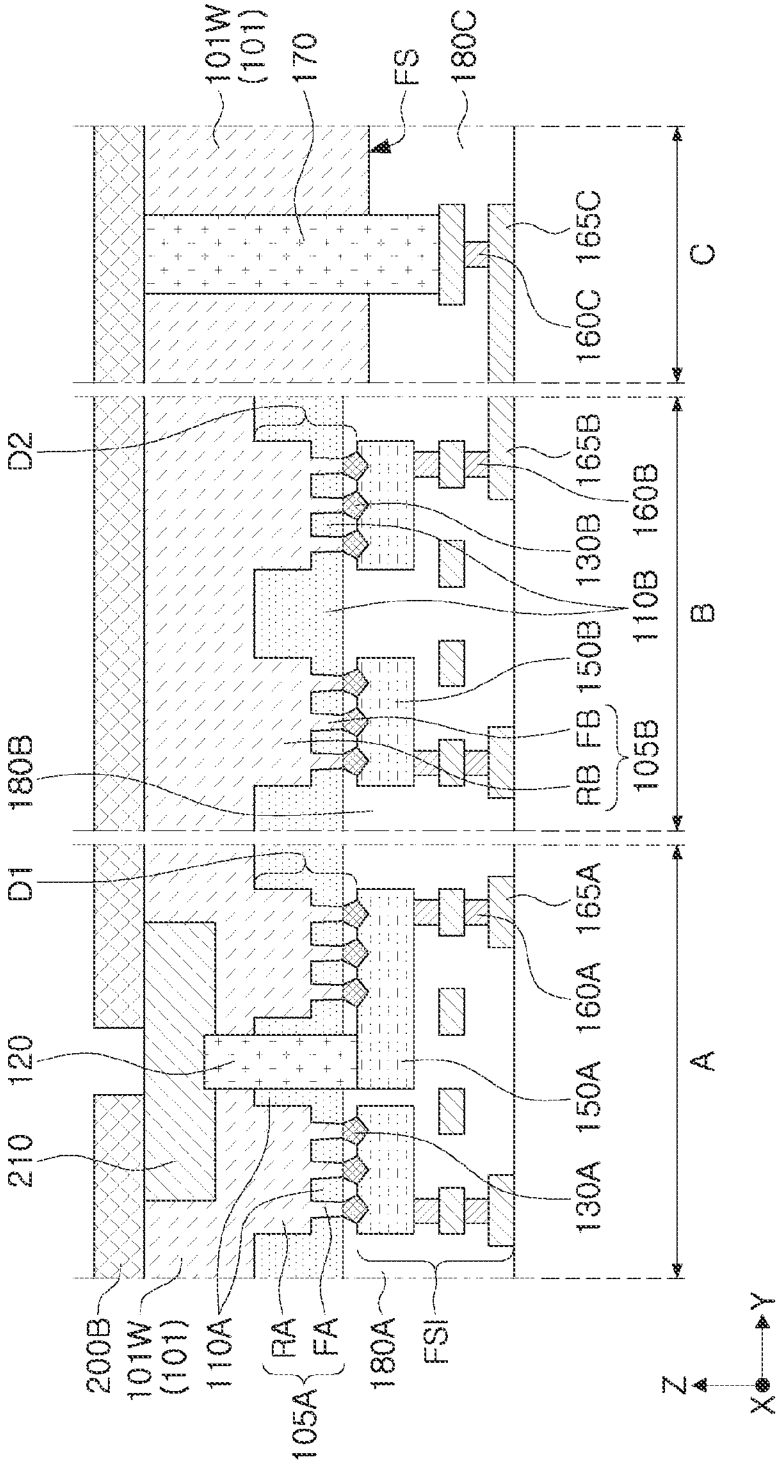

Referring to FIG. 6E, a second mask layer 200B may be formed on the back side BS of the semiconductor wafer 101W, and a photo process and an etching process may be performed, to partially open a portion of the second mask layer 200B in the first region A. In an embodiment, the second mask layer 200B is formed on upper left and upper right surfaces of the back side buried insulating layer 210 spaced apart from one another, but not on a middle upper surface of the back side buried insulating layer 210 disposed on the buried conductive layer 120 between the upper left and upper right surfaces.

Figure 6F:
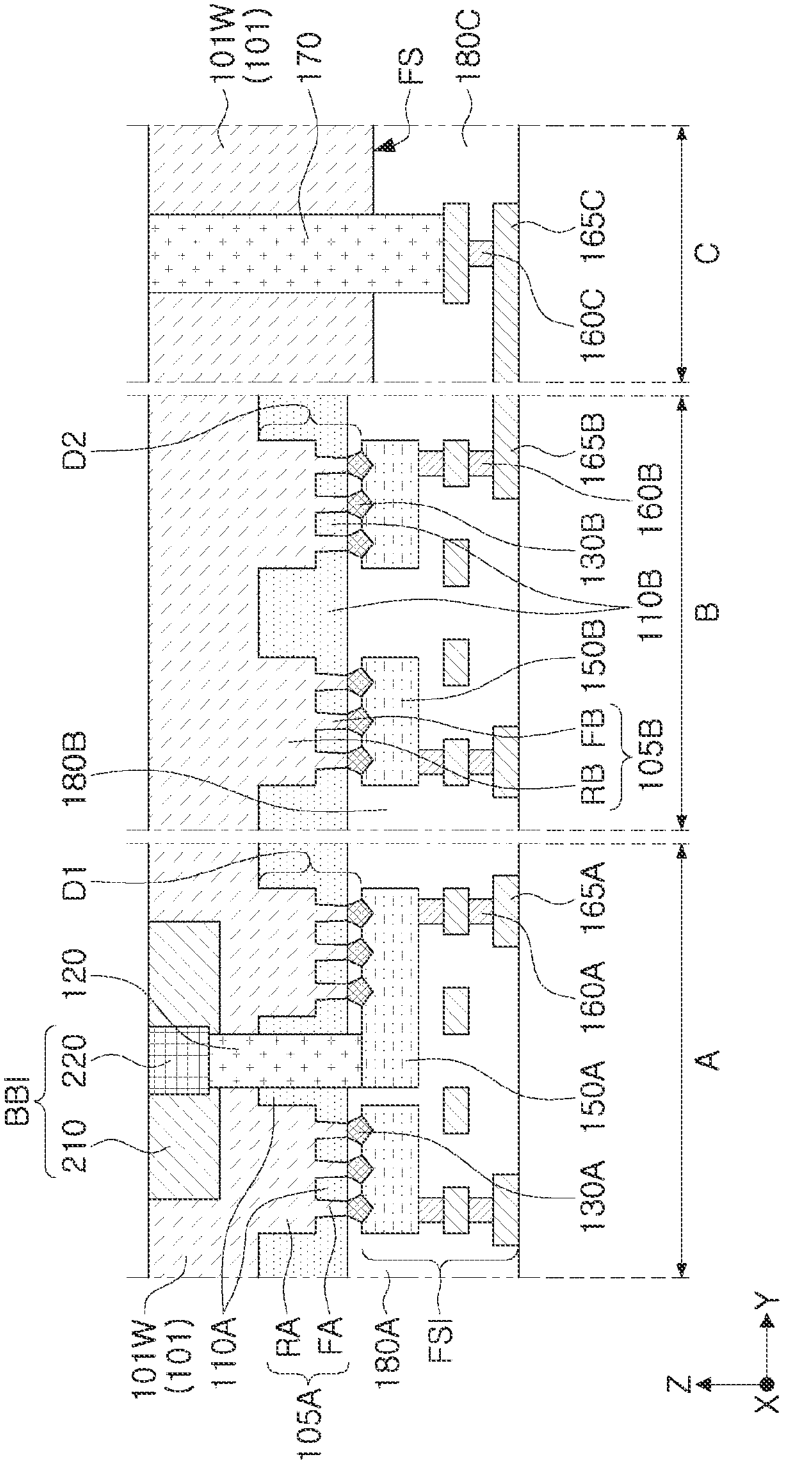

Referring to FIG. 6F, a back side buried insulating layer 210 may be etched downwardly of the partially open region of the second mask layer 200B in the first region A, and a back side buried conductive layer 220, buried in the back side buried insulating layer 210 may be formed. Accordingly, a back side buried interconnection structure BBI may be formed in the first region A.

Next, the semiconductor device 100A of FIGS. 1A and 1B may be manufactured by forming back side interlayer insulating layers 280A, 280B, and 280C, and back side vias 260A and 260C and back side interconnection layers 265A and 265C constituting the back side interconnection structure BSI.

FIGS. 7A to 7H are diagrams illustrating a process sequence in a method of manufacturing a semiconductor device according to an example embodiment.

Figure 7A:
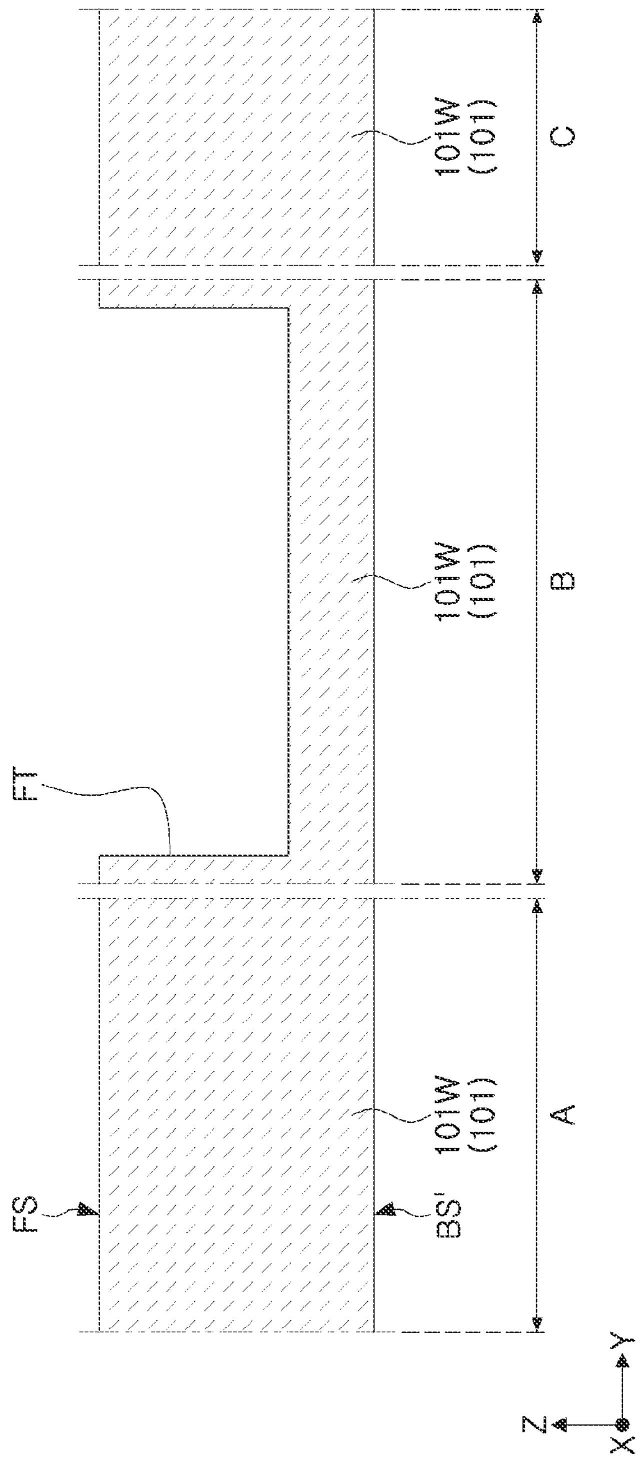
FIGS. 7A to 7H are diagrams illustrating a process sequence to illustrate a method of manufacturing a semiconductor device according to an example embodiment.

Referring to FIG. 7A, a front trench FT is formed on a front side FS of a semiconductor wafer 101W including the substrate 101. The front trench FT may be formed in a direction from a front side FS of the semiconductor wafer 101W toward a back side BS' of the semiconductor wafer 101W in the second region B.

Figure 7B:
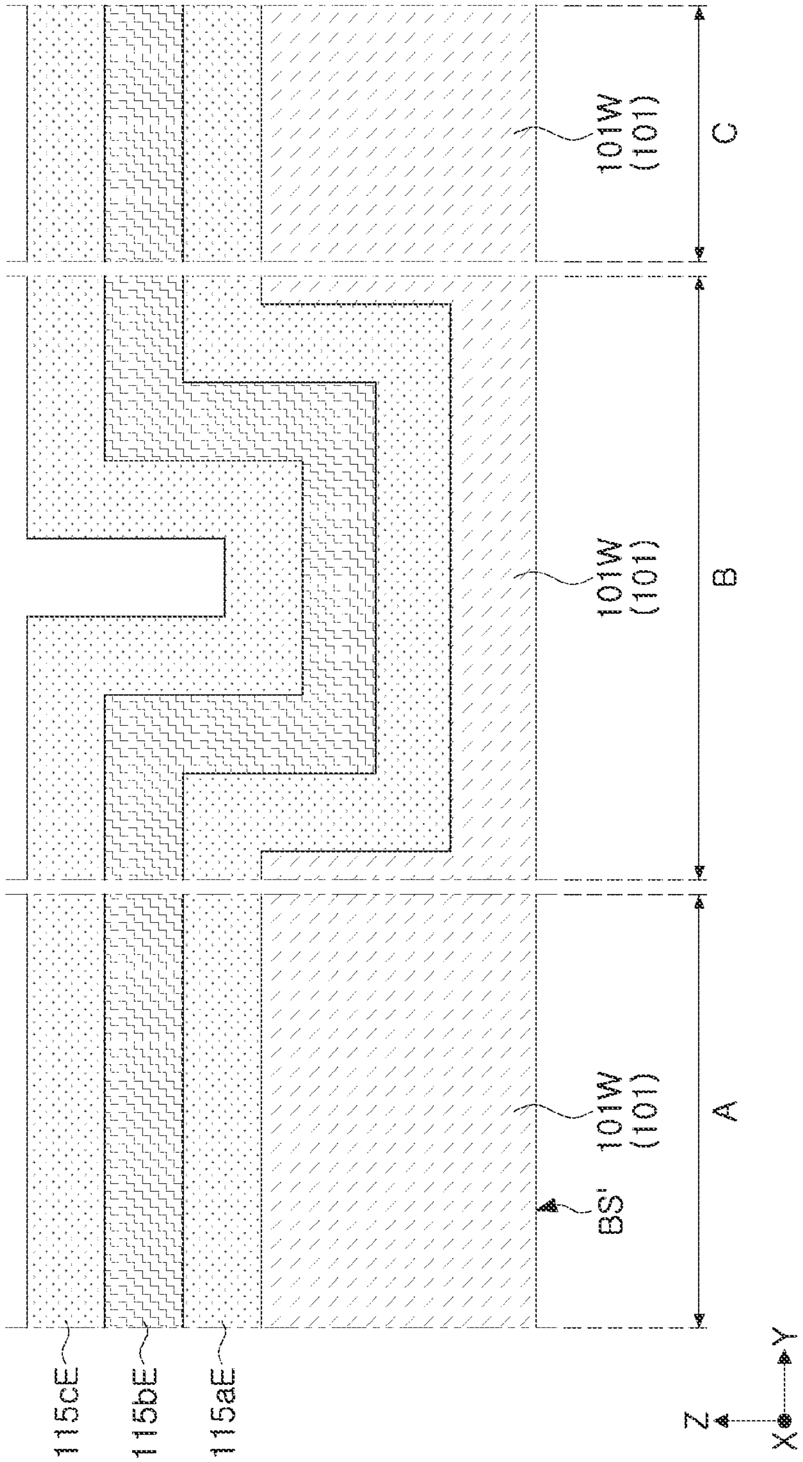

Referring to FIG. 7B, an epitaxial growth process may be performed on the front side FS of the semiconductor wafer 101W to form first to third epitaxial layers 115*a*E, 115*b*E, and 115*c*E including impurities. The first to third epitaxial layers 115*a*E, 115*b*E, and 115*c*E may be formed to fill the front trench FT.

Figure 7C:
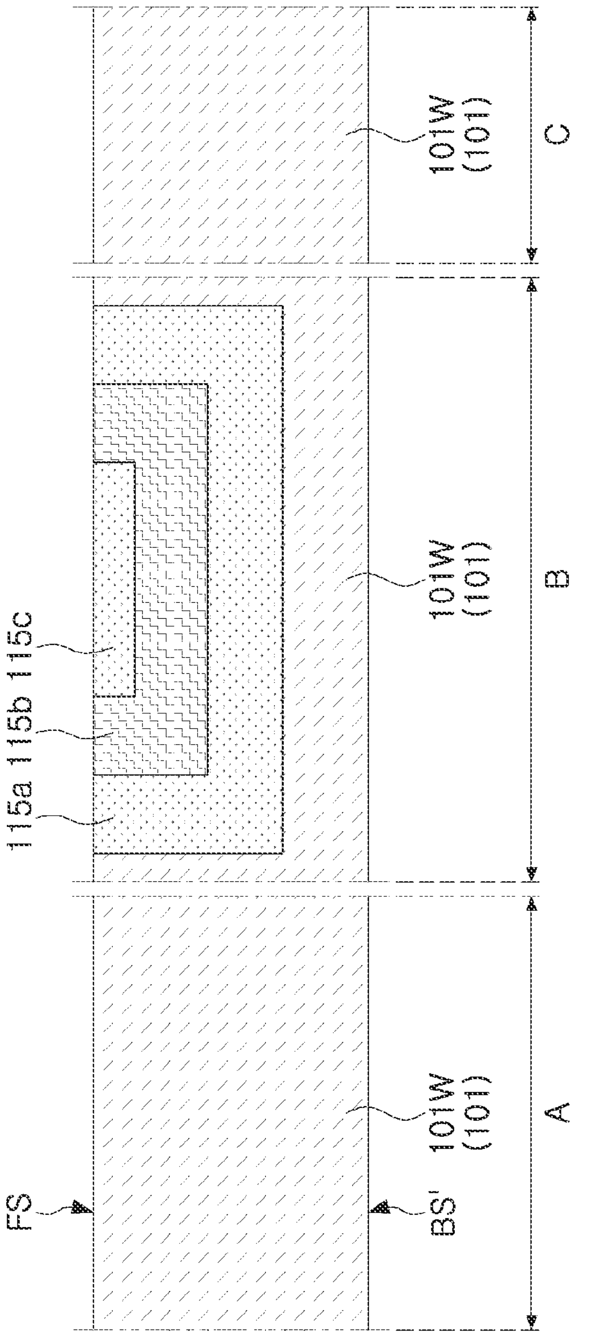

Referring to FIG. 7C, a planarization process may be performed on the front side FS of the semiconductor wafer 101W to form impurity regions 115*a*, 115*b*, and 115*c* buried in the semiconductor wafer 101W. The impurity regions 115*a*, 115*b*, and 115*c* may be formed by remaining portions of the first to third epitaxial layers 115*a*E, 115*b*E, and 115*c*E filling the front trench FT. The planarization process may remove portions of the 115*a*E, 115*b*E, and 115*c*EE until upper surfaces of impurity regions 115*a*, 115*b*, and 115*c* are flat or substantially flat or coplanar or substantially coplanar with one another.

Figure 7D:
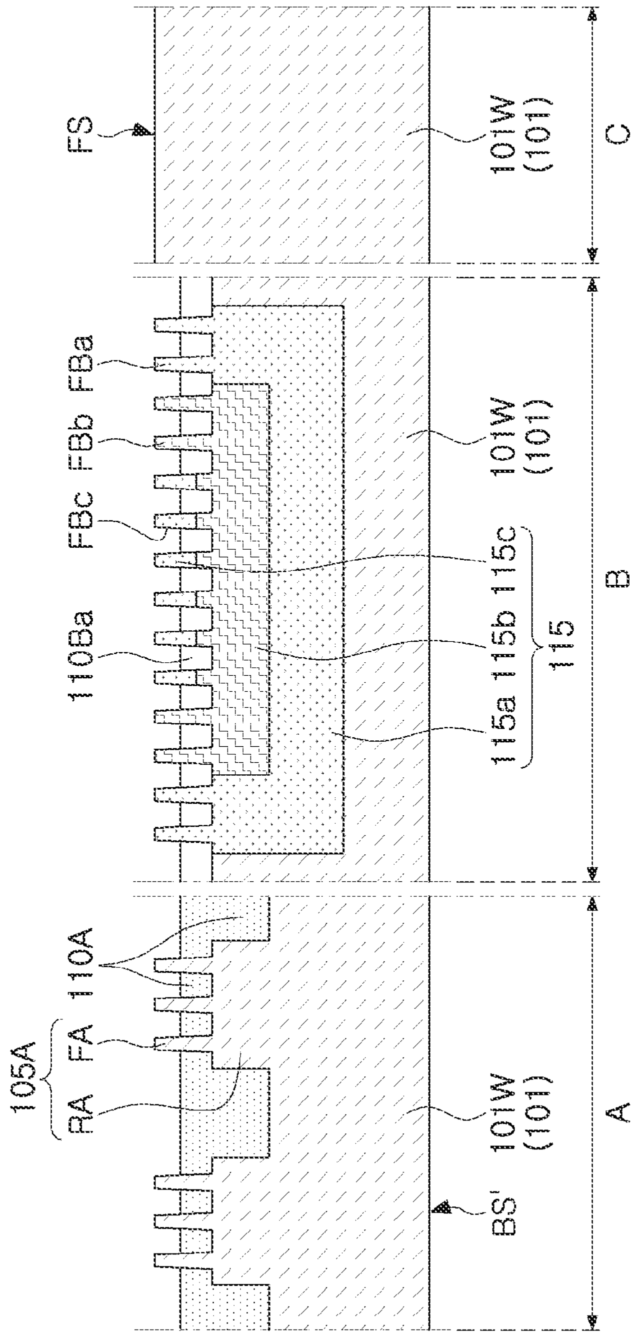

Referring to FIG. 7D, a portion of the semiconductor wafer 101W may be etched in the first region A to form first active regions 105A including first active fins FA, and portions of the impurity regions 115*a*, 115*b*, and 115*c* may be etched in the second region B to form fin patterns FBa, FBb, and FBc. A first device isolation layer 110A may be formed between the first active regions 105A, and a second device isolation layer 110Ba may be formed between the fin patterns FBa, FBb, and FBc.

Figure 7E:
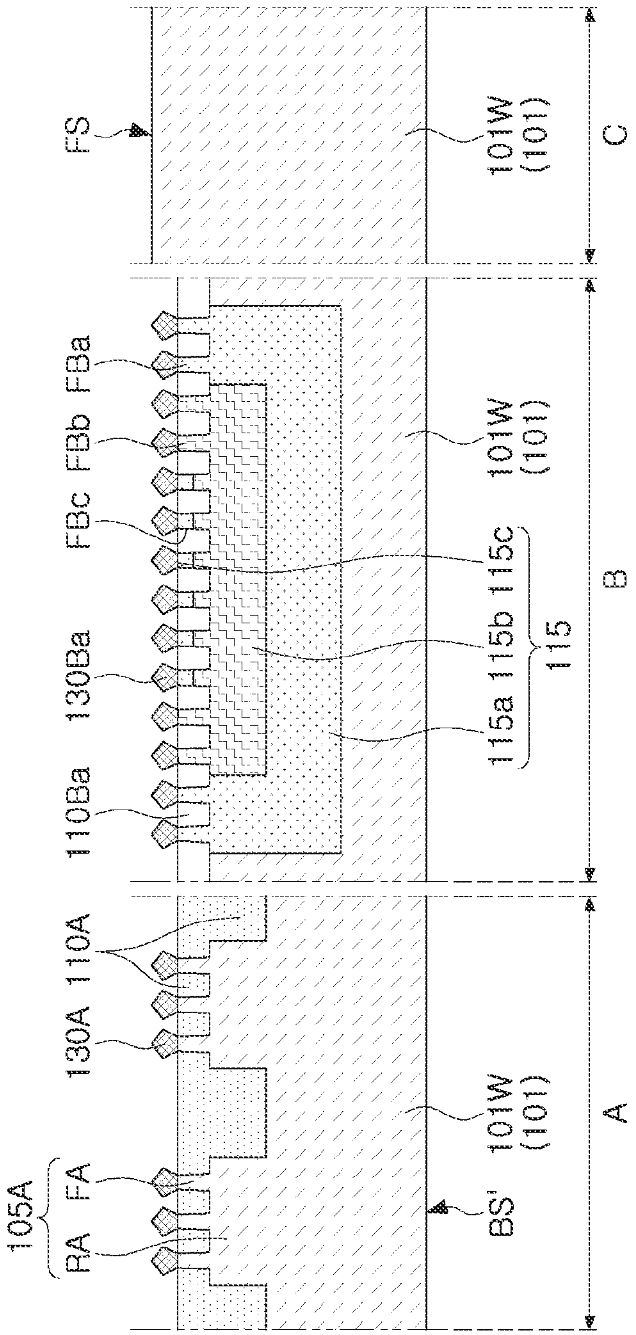

Referring to FIG. 7E, first source/drain regions 130A partially etching the first active fins FA and the fin patterns FBa, FBb, and FBc, and including an epitaxial layer on the first active fins FA recessed in the first region A, and epitaxial layers 130Ba may be formed on the fin patterns FBa, FBb, and FBc recessed in the second region B. Before the first active fins FA and the fin patterns FBa, FBb, and FBc are partially etched, a first gate 140 crossing the first active fins FA may be formed.

Figure 7F:
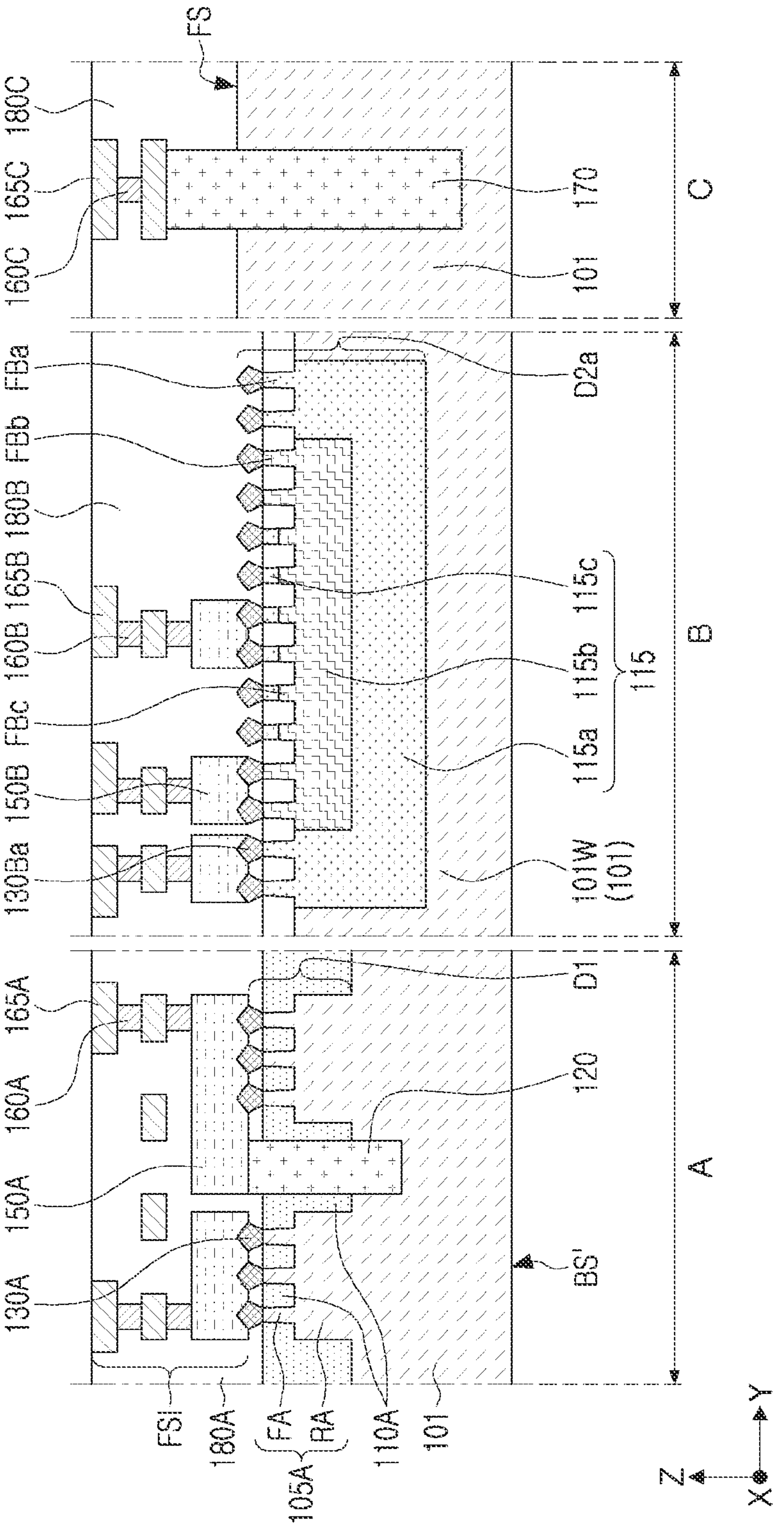

Referring to FIG. 7F, a buried conductive layer 120, a through-electrode 170, and a front side interconnection structure FSI may be formed on a front side FS of the semiconductor wafer 101W.

Figure 7G:
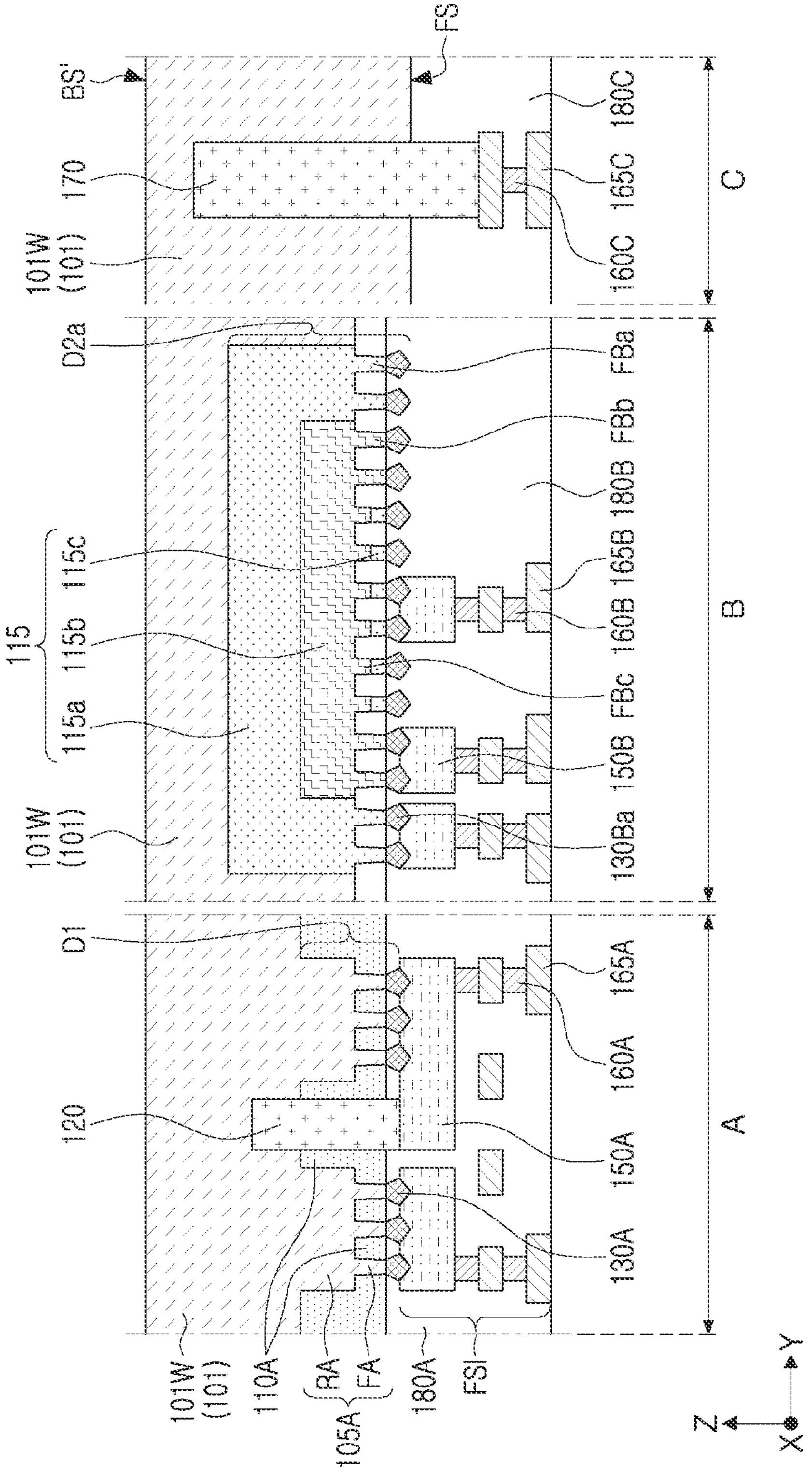
Figure 7H:
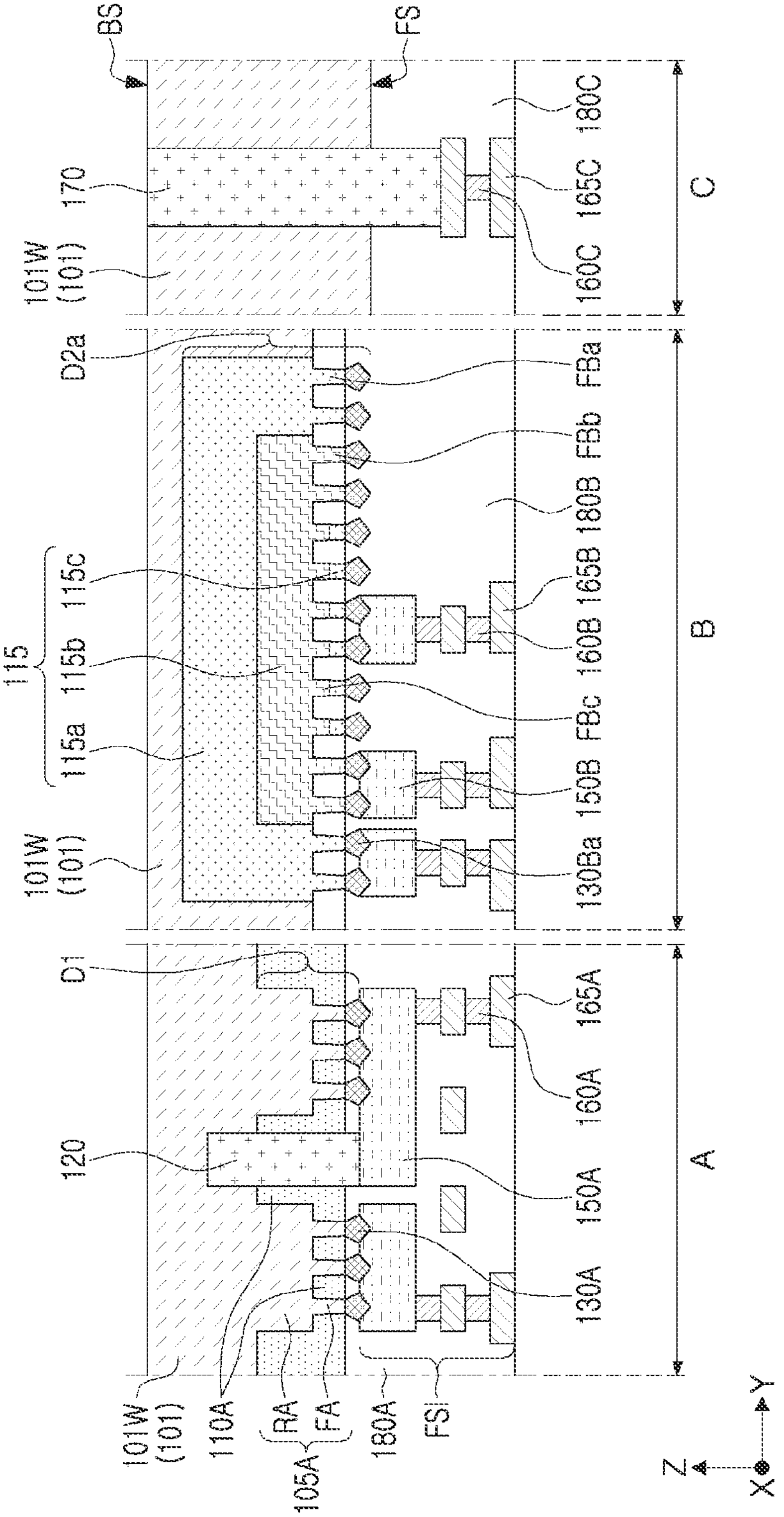

Referring to FIG. 7G, the semiconductor wafer 101W may be turned over, and referring to FIG. 7H, a back side grinding process for reducing a thickness of the semiconductor wafer 101W may be performed. By the back side grinding process, the through-electrode 170 may be exposed.

Next, a back side buried interconnection structure BBI may be formed on a back side BS of the substrate 101 in a required region, for example, a first region A. Next, the semiconductor device 100B of FIG. 2 may be manufactured by forming back side interlayer insulating layers 280A, 280B, and 280C, and back side vias 260A and 260C and back side interconnection layers 265A and 265C constituting the back side interconnection structure BSI.

FIGS. 8A to 8F are diagrams illustrating a process sequence to illustrate a method of manufacturing a semiconductor device according to an example embodiment.

Figure 8A:
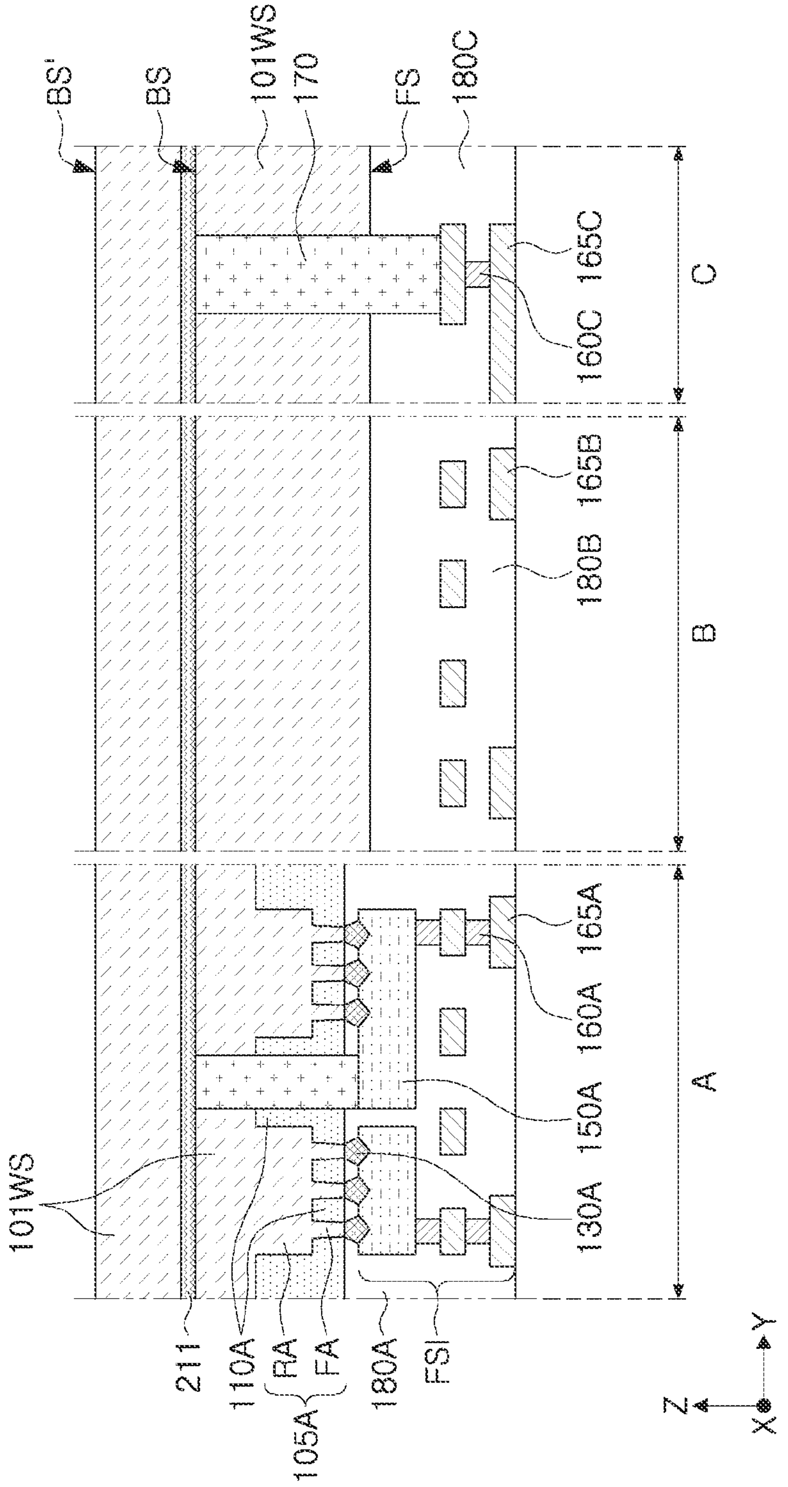
FIGS. 8A to 8F are diagrams illustrating a process sequence to illustrate a method of manufacturing a semiconductor device according to an example embodiment.

Referring to FIG. 8A, first devices D1, a buried conductive layer 120, a through-electrode 170, and a front side interconnection structure FSI may be formed on a front side FS of a semiconductor wafer 101WS including an SOI substrate by a FEOL process. The semiconductor wafer 101WS is a semiconductor wafer in a state before a back side BS' is subjected to back side grinding, and may have a relatively thick thickness. The SOI substrate may include a first insulating layer 211 buried in the semiconductor wafer 101WS.

Figure 8B:
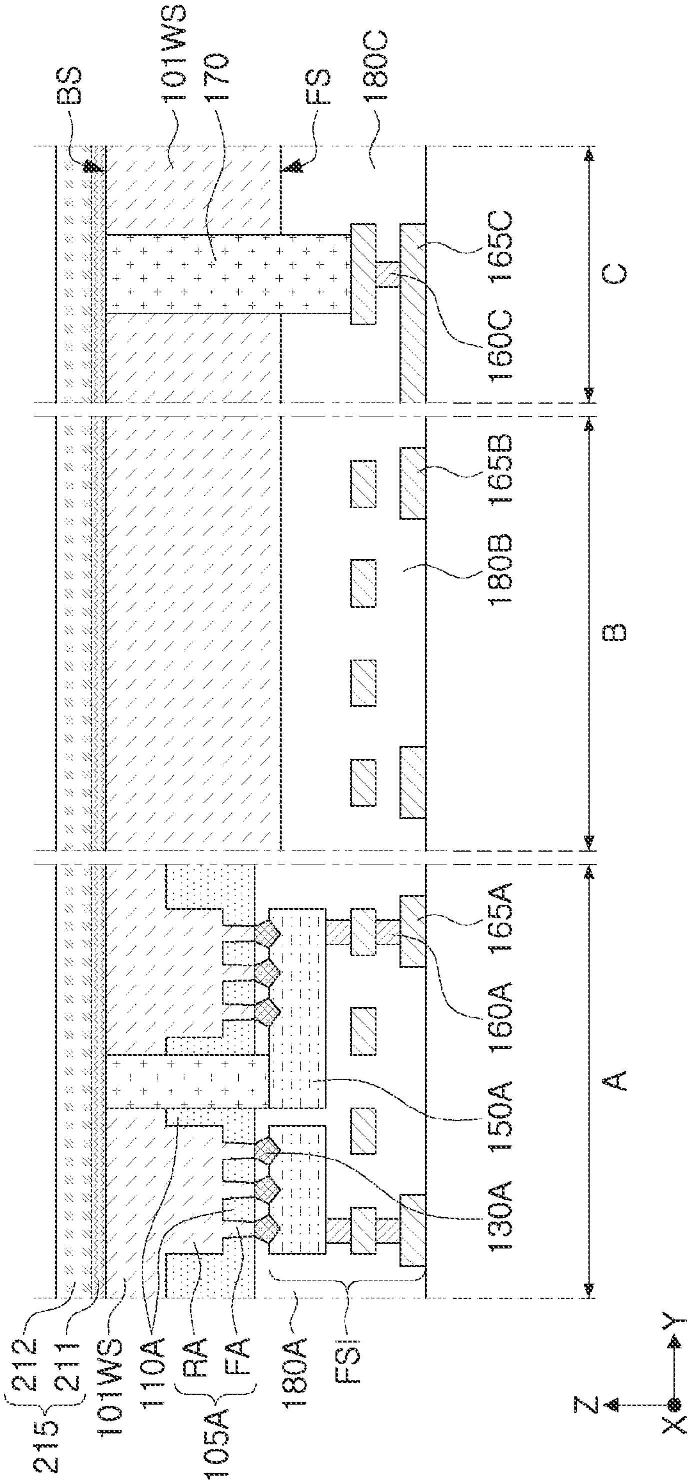

Referring to FIG. 8B, a back side grinding process is performed on a back side BS' of the semiconductor wafer 101WS to reduce a thickness of the semiconductor wafer 101WS to form a back side BS, and a second insulating layer 212 may be formed on a first insulating layer 211. In the back side grinding process, the first insulating layer 211 may be used as a stopper layer or an etch stop layer. The second insulating layer 212 may be formed on the first insulating layer 211. The second insulating layer 212 may be formed of a material, different from that of the first insulating layer 211. The first insulating layer 211 and the second insulating layer 212 may form a back side insulating structure 215 covering a back side BS of the semiconductor wafer 101WS.

Figure 8C:
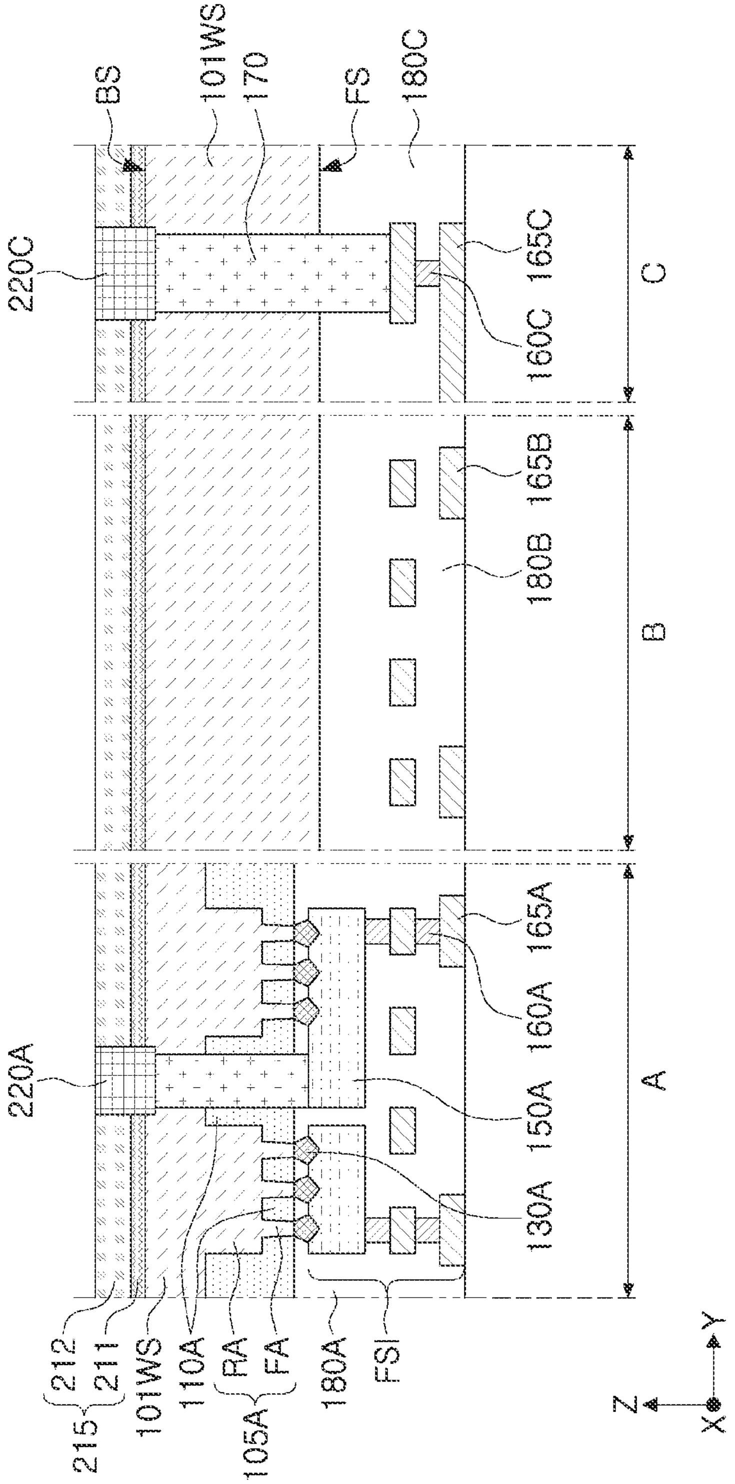

Referring to FIG. 8C, by performing a photo process and an etching process, openings may be formed in the back side insulating structure 215 and back side buried conductive layers 220A and 220C filling the openings may be formed. The first back side buried conductive layer 220A, among the back side buried conductive layers 220A and 220C may be connected to the buried conductive layer 120, and the second back side buried conductive layer 220C may be connected to the through-electrode 170.

Figure 8D:
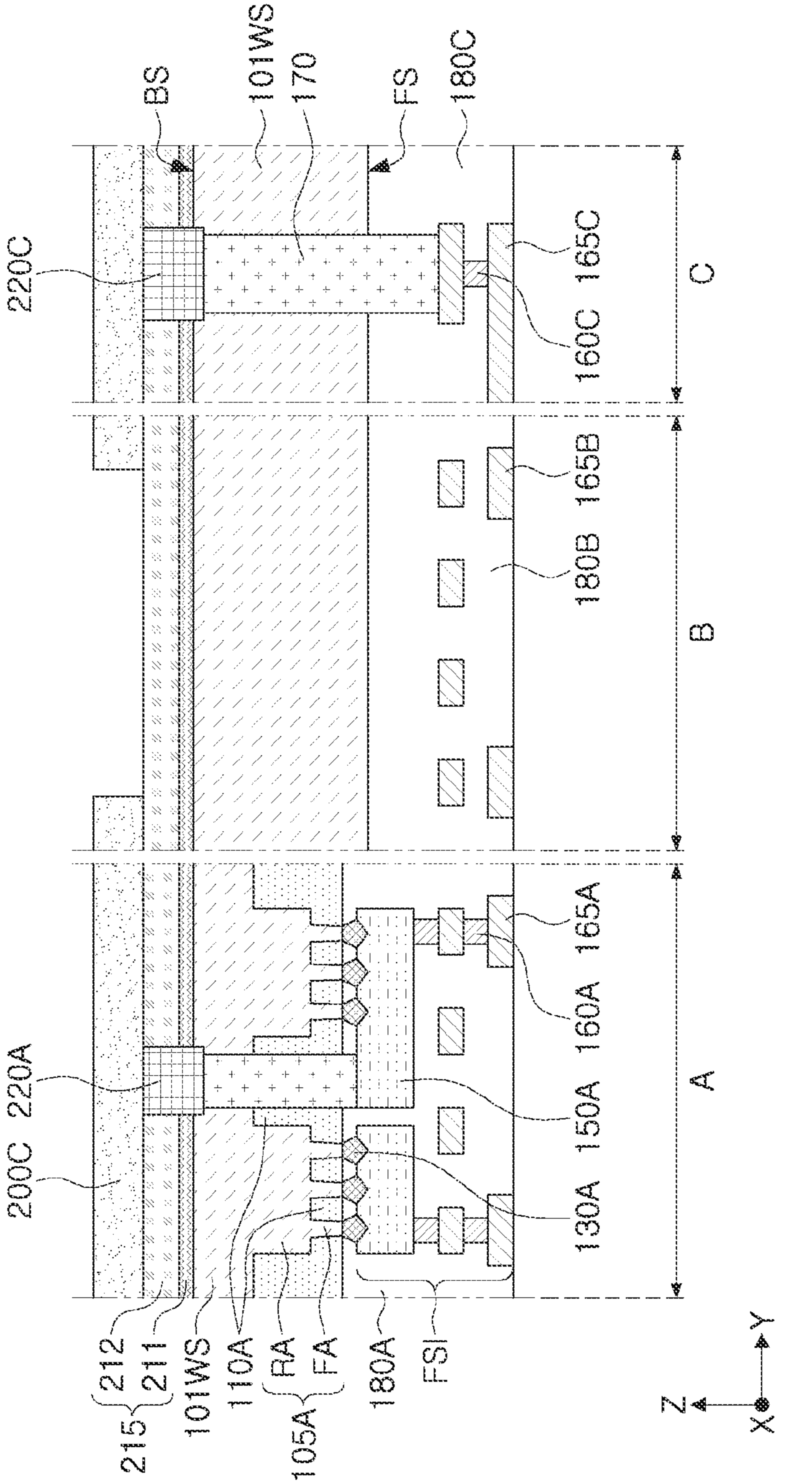

Referring to FIG. 8D, a mask layer 200C may be formed on the back side insulating structure 215, and a photo process may be performed to partially open the mask layer 200C. For example, a first portion of the mask layer 200*c* may be formed in the entire first region A and a second portion of the mask layer 200*c* may be formed in the entire third region C. The mask layer 200*c* may extend slightly into the second region B or may be not present at all in the second region B.

Figure 8E:
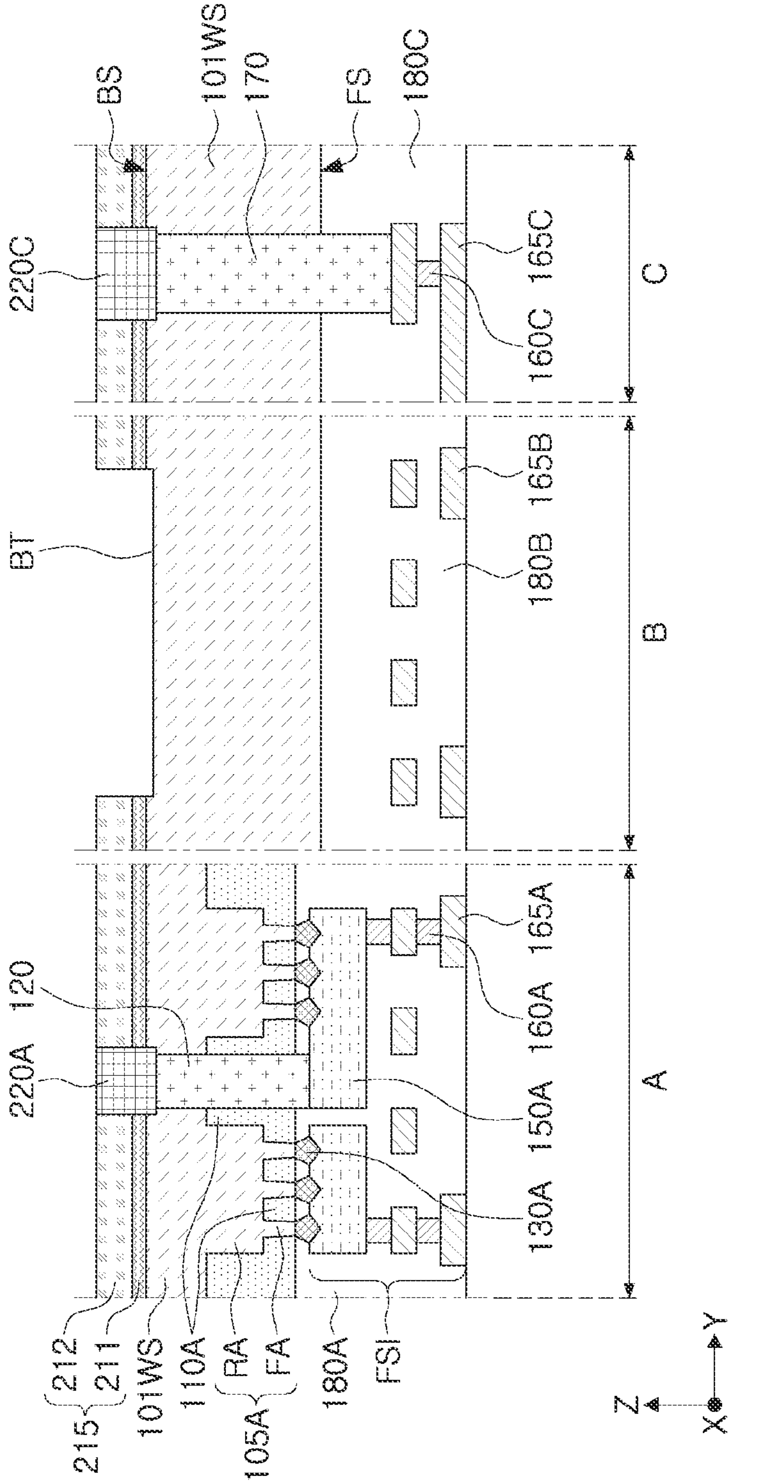

Referring to FIG. 8E, an etching process may be performed to form a back side trench BT penetrating through the back side insulating structure 215, and recessing the back side BS of the semiconductor wafer 101WS. For example, a portion of the back side insulating structure 215 in the second region B may be entirely removed and a portion of the semiconductor wafer 101WS in the second region B may be removed during the etching process to form the back side trench BT.

Figure 8F:
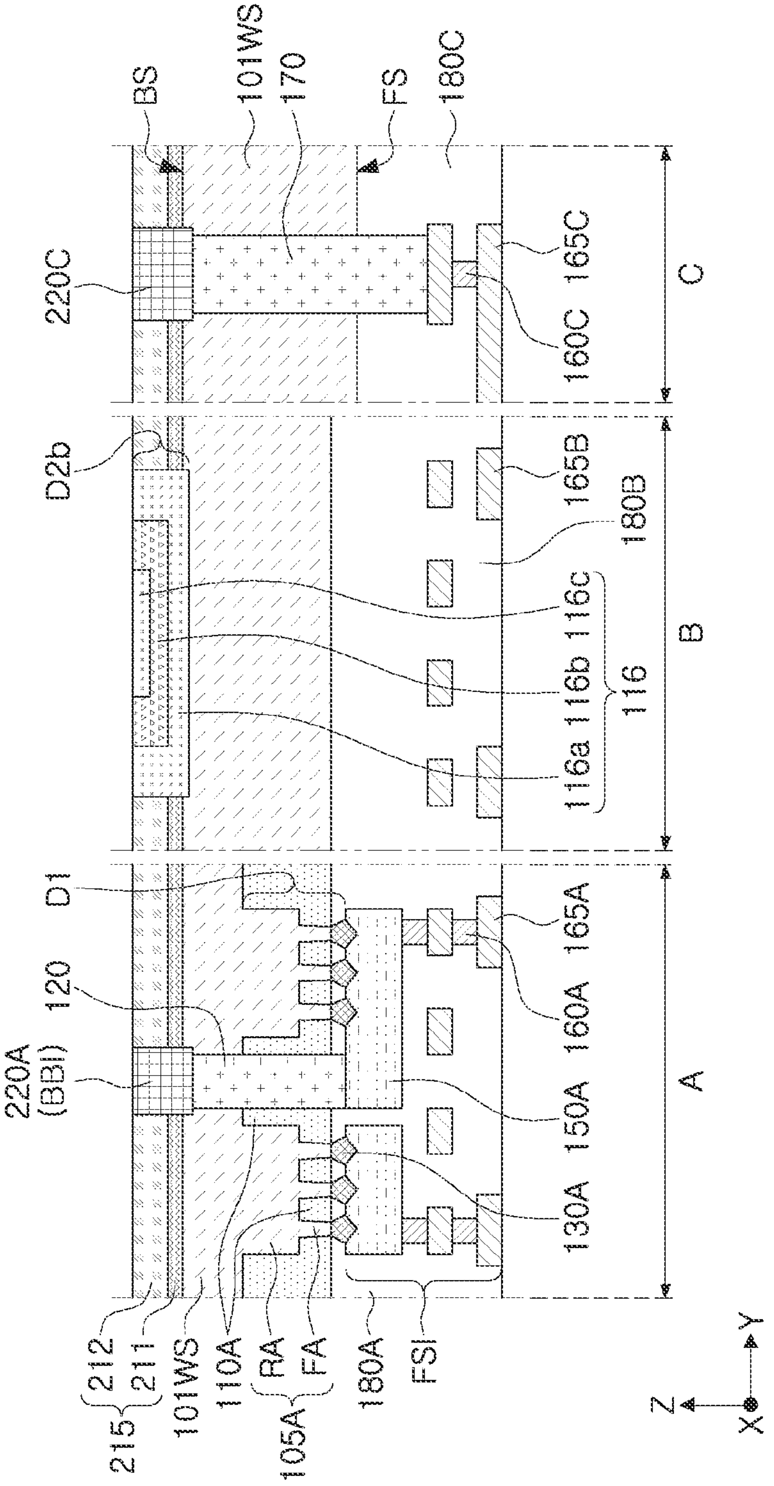

Referring to FIG. 8F, an epitaxial layer 116 may be formed by performing an epitaxial growth process on the back side BS of the semiconductor wafer 101WS. For example, after the epitaxial layer 116 is grown from a bottom surface of the back side trench BT, impurities may be doped by ion implantation to form impurity regions 116*a*, 116*b*, and 116*c*. For example, during the epitaxial growth process, impurities of different conductivity-types may be implanted to form impurity regions 116*a*, 116*b*, and 116*c*.

Next, the semiconductor device 100C of FIG. 3 may be manufactured by forming back side interlayer insulating layers 280A, 280B, and 280C, and back side vias 260A, 260B, and 260C and back side interconnection layers 265A, 265B, and 265C constituting the back side interconnection structure BSI.

As set forth above, by disposing a back side buried interconnection structure in a selected region on a back side of a substrate on which devices having various functions are disposed, a semiconductor device having increased integration and capable of being manufactured more efficiently may be provided.

Terms used herein are used only in order to describe an example embodiment rather than limiting the present disclosure. In this case, singular forms include plural forms unless interpreted otherwise in context.

While example embodiments have been shown and described above, it will be apparent to those skilled in the art that modifications, variations, and combination of embodiments could be made without departing from the scope of the present inventive concept.

What is claimed is:

1. A semiconductor device, comprising:

a substrate comprising a first region, a second region, and a third region;

a first device disposed on a front side of the substrate, in the first region, wherein the first device includes a first active region, the first active region being disposed in the first region and not extending into the second region or the third region, a first gate crossing the first active region, and first source/drain regions on the first active region on both sides of the first gate;

a second device disposed on the front side of the substrate, in the second region;

a through-electrode penetrating through the substrate, in the third region;

a contact plug electrically connected to the first source/drain regions;

a buried conductive layer connected to the contact plug, and penetrating through a first device isolation layer defining the first active region in the substrate and extending deeper into the substrate than the first device isolation layer; and a back side buried interconnection structure disposed adjacent to a back side of the substrate that opposes the front side of the substrate, wherein the back side buried interconnection structure includes a back side buried conductive layer disposed on the buried conductive layer in the first region and connected to the buried conductive layer, and wherein the back side buried interconnection structure is not disposed on the back side of the substrate in the second region.

2. The semiconductor device of claim 1, wherein the back side buried interconnection structure further comprises a back side buried insulating layer surrounding side surfaces of the back side buried conductive layer.

3. The semiconductor device of claim 2, wherein the back side buried insulating layer is disposed in a trench recessed from the back side of the substrate toward the front side of the substrate in the first region, wherein the back side buried conductive layer is disposed in the back side buried insulating layer.

4. The semiconductor device of claim 3, wherein a step is provided by the trench on the back side of the substrate in the first region, wherein the back side of the substrate is substantially flat in the second region.

5. The semiconductor device of claim 2, wherein an upper surface of the back side buried insulating layer and an upper surface of the back side buried conductive layer are substantially coplanar.

6. The semiconductor device of claim 2, wherein a lower surface of the back side buried insulating layer is on a level lower than a lower surface of the back side buried conductive layer.

7. The semiconductor device of claim 2, wherein an upper portion of the buried conductive layer protrudes onto a lower surface of the back side buried insulating layer.

8. The semiconductor device of claim 1, wherein the first active region comprises a first base active region and at least one first active fin, wherein the at least one first active fin protrudes from the first base active region and extends in a first direction.

9. The semiconductor device of claim 8, wherein the first device further comprises a plurality of first channel layers spaced apart from the at least one first active fin, and surrounded by the first gate.

10. The semiconductor device of claim 1, wherein the second device is a static-random-access memory (SRAM) including a second active region, a second gate crossing the second active region, and second source/drain regions disposed on the second active region on both sides of the second gate, and wherein the first device does not include a memory device.

11. The semiconductor device of claim 1, wherein the second device is a bipolar junction transistor including a base, an emitter, and a collector, and wherein the first device does not include the bipolar junction transistor.

12. The semiconductor device of claim 1, wherein the semiconductor device further comprises a front side interconnection structure disposed on the front side of the substrate, wherein the front side interconnection structure further comprises first interconnection layers electrically connected to the first device, second interconnection layers electrically connected to the second device, and third interconnection layers electrically connected to the through-electrode, and wherein the third interconnection layers are not disposed in the first region.

13. A semiconductor device, comprising:

a substrate comprising a first region, a second region, and a third region;

a first device disposed on a front side of the substrate, in the first region, wherein the first device includes a first active region, a first gate crossing the first active region, and first source/drain regions on the first active region on both sides of the first gate;

a second device disposed on the front side of the substrate, in the second region;

a through-electrode penetrating through the substrate, in the third region;

a contact plug electrically connected to the first source/drain regions;

a buried conductive layer connected to the contact plug, and penetrating through a first device isolation layer defining the first active region in the substrate and extending deeper into the substrate than the first device isolation layer; and a back side buried interconnection structure disposed adjacent to a back side of the substrate that opposes the front side of the substrate, wherein the back side buried interconnection structure includes a back side buried conductive layer disposed on the buried conductive layer in the first region and connected to the buried conductive layer, wherein the back side buried interconnection structure is not disposed on the back side of the substrate in the second region, wherein the semiconductor device further comprises a front side interconnection structure disposed on the front side of the substrate, wherein the front side interconnection structure further comprises first interconnection layers electrically connected to the first device, second interconnection layers electrically connected to the second device, and third interconnection layers electrically connected to the through-electrode, wherein a power supply voltage is supplied to the first device through the back side buried conductive layer and the buried conductive layer, and wherein a power supply voltage is supplied to the second device through the through-electrode, a portion of the second interconnection layers, and a portion of the third interconnection layers.

14. The semiconductor device of claim 13, wherein the second device is a static-random-access memory (SRAM), and wherein the first device does not include a memory device.

15. The semiconductor device of claim 13, wherein the third interconnection layers are not disposed in the first region.

16. A semiconductor device, comprising:

a substrate comprising a first region, a second region, and a third region;

a first device disposed on a front side of the substrate, in the first region, wherein the first device includes a first active region, a first gate crossing the first active region, and first source/drain regions on the first active region on both sides of the first gate;

a second device disposed on the front side of the substrate, in the second region;

a through-electrode penetrating through the substrate, in the third region;

a contact plug electrically connected to the first source/drain regions;

a buried conductive layer connected to the contact plug, and penetrating through a first device isolation layer defining the first active region in the substrate and extending deeper into the substrate than the first device isolation layer; and a back side buried interconnection structure disposed adjacent to a back side of the substrate that opposes the front side of the substrate, wherein the back side buried interconnection structure includes a back side buried conductive layer disposed on the buried conductive layer in the first region and connected to the buried conductive layer, wherein the back side buried interconnection structure is not disposed on the back side of the substrate in the second region, wherein the second device includes an epitaxial layer in a front side trench recessing the front side of the substrate, and wherein the epitaxial layer includes a first impurity region of a first conductivity-type, a second impurity region of a second conductivity-type, different from the first conductivity-type, and a third impurity region of the first conductivity-type.

17. The semiconductor device of claim 16, wherein the first device includes a logic device, and the second device does not include the logic device.

18. The semiconductor device of claim 16, wherein the semiconductor device further comprises a front side interconnection structure disposed on the front side of the substrate, wherein the front side interconnection structure further comprises first interconnection layers electrically connected to the first device, second interconnection layers electrically connected to the second device, and third interconnection layers electrically connected to the through-electrode, and wherein the third interconnection layers are not disposed in the first region.

* * * * *